US011830810B2

(12) United States Patent
Flowers et al.

(10) Patent No.: US 11,830,810 B2
(45) Date of Patent: *Nov. 28, 2023

(54) PACKAGED TRANSISTOR HAVING DIE ATTACH MATERIALS WITH CHANNELS AND PROCESS OF IMPLEMENTING THE SAME

(71) Applicant: WOLFSPEED, INC., Durham, NC (US)

(72) Inventors: Mitch Flowers, Durham, NC (US); Erwin Cohen, Durham, NC (US); Alexander Komposch, Morgan Hill, CA (US); Larry Christopher Wall, Chapel Hill, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/085,433

(22) Filed: Oct. 30, 2020

(65) Prior Publication Data

US 2021/0351121 A1   Nov. 11, 2021

Related U.S. Application Data

(63) Continuation-in-part of application No. 16/868,639, filed on May 7, 2020, now Pat. No. 11,424,177.

(Continued)

(51) Int. Cl.
*H01L 23/528* (2006.01)

(52) U.S. Cl.
CPC .. *H01L 23/528* (2013.01); *H01L 2924/13064* (2013.01); *H01L 2924/1423* (2013.01)

(58) Field of Classification Search
CPC ............... H01L 23/528; H01L 23/3107; H01L 23/49513; H01L 2924/13064; H01L 2924/1423; H01L 2224/29239; H01L 2224/8384; H01L 2224/29393; H01L 2224/2732; H01L 2224/30051;
(Continued)

(56) References Cited

U.S. PATENT DOCUMENTS 5,528,075 A     6/1996   Burns
5,585,671 A * 12/1996   Nagesh ................. H01L 23/367
                                                                           257/713
(Continued)

FOREIGN PATENT DOCUMENTS

EP            1898459 A2     3/2008

OTHER PUBLICATIONS

International Patent Application No. PCT/US2021/029848; Int'l Search Report and the Written Opinion; dated Aug. 17, 2021; 15 pages.

(Continued)

*Primary Examiner* — Khiem D Nguyen
(74) *Attorney, Agent, or Firm* — BakerHostetler

(57) ABSTRACT

A package includes a circuit that includes at least one active area and at least one secondary device area, a support configured to support the circuit, and a die attach material. The circuit being mounted on the support using the die attach material and the die attach material including at least one channel configured to allow gases generated during curing of the die attach material to be released from the die attach material.

22 Claims, 27 Drawing Sheets

Related U.S. Application Data

(60) Provisional application No. 63/055,541, filed on Jul. 23, 2020.

(58) Field of Classification Search
CPC ..... H01L 2224/2934; H01L 2224/3225; H01L 2224/32245; H01L 2224/29347; H01L 2224/32225; H01L 2224/27312; H01L 2224/27334; H01L 2224/48245; H01L 2224/48227; H01L 2224/3012; H01L 2224/3003; H01L 2224/29339; H01L 24/27; H01L 24/29; H01L 24/32; H01L 24/33; H01L 24/83; H01L 2224/32221; H01L 2224/83855; H01L 23/12; H01L 29/778; H01L 2223/6683
USPC .......................................... 257/773, 782, 783
See application file for complete search history.

(56) References Cited

U.S. PATENT DOCUMENTS

| | | |
|---|---|---|
| 6,413,801 B1 | 7/2002 | Lin |
| 6,861,720 B1 * | 3/2005 | Heckman ............ G02B 26/0841 |
| | | 257/433 |
| 6,890,065 B1 * | 5/2005 | Spivey .................... B41J 2/1634 |
| | | 347/65 |
| 8,124,460 B2 | 2/2012 | Chow et al. |
| 9,305,889 B2 * | 4/2016 | Powell ................ H01L 21/4832 |
| 9,601,327 B2 * | 3/2017 | McCann ............. H01L 21/6835 |
| 10,262,912 B2 * | 4/2019 | Kajihara ............. B29C 45/1671 |
| 10,861,796 B2 * | 12/2020 | Cook ................ H01L 23/49575 |
| 2003/0094690 A1 | 5/2003 | Dickey et al. |
| 2003/0183677 A1 | 10/2003 | Farrar et al. |
| 2005/0023663 A1 * | 2/2005 | Chen .................... H01L 23/3121 |
| | | 257/678 |
| 2006/0214313 A1 * | 9/2006 | Pieda .................. H01L 23/3121 |
| | | 257/E23.125 |
| 2007/0278683 A1 * | 12/2007 | Santos ................ H01L 25/0657 |
| | | 257/759 |
| 2008/0290494 A1 * | 11/2008 | Lutz ....................... B81B 3/0005 |
| | | 257/E23.125 |
| 2010/0019373 A1 * | 1/2010 | Fan ......................... H01L 24/32 |
| | | 257/E23.079 |
| 2010/0117224 A1 * | 5/2010 | McElrea ........... H01L 27/14618 |
| | | 257/723 |
| 2011/0227229 A1 * | 9/2011 | Bauer ..................... H01L 24/32 |
| | | 257/773 |
| 2011/0266663 A1 * | 11/2011 | Bauer ............... H01L 23/49503 |
| | | 257/676 |
| 2012/0211764 A1 | 8/2012 | Okamoto et al. |
| 2012/0261689 A1 | 10/2012 | Appelt et al. |
| 2014/0375387 A1 | 12/2014 | Campbell |
| 2015/0041974 A1 * | 2/2015 | Kobayashi ........... B23K 35/365 |
| | | 252/514 |
| 2015/0333031 A1 | 11/2015 | Viswanathan et al. |
| 2016/0093558 A1 * | 3/2016 | Cook .................. H01L 21/4825 |
| | | 257/676 |
| 2016/0372339 A1 | 12/2016 | Uehling |
| 2017/0033749 A1 * | 2/2017 | Schmukler ................ H03F 3/21 |
| 2018/0047700 A1 * | 2/2018 | Spory ..................... H01L 24/98 |
| 2019/0013242 A1 * | 1/2019 | Molla ..................... H01L 24/32 |
| 2019/0259685 A1 | 8/2019 | Hussain et al. |

OTHER PUBLICATIONS

22.International Patent Application No. PCT/US2021/029848; Int'l Prelimiary Report on Patentability; dated Nov. 17, 2022; 10 pages.

* cited by examiner

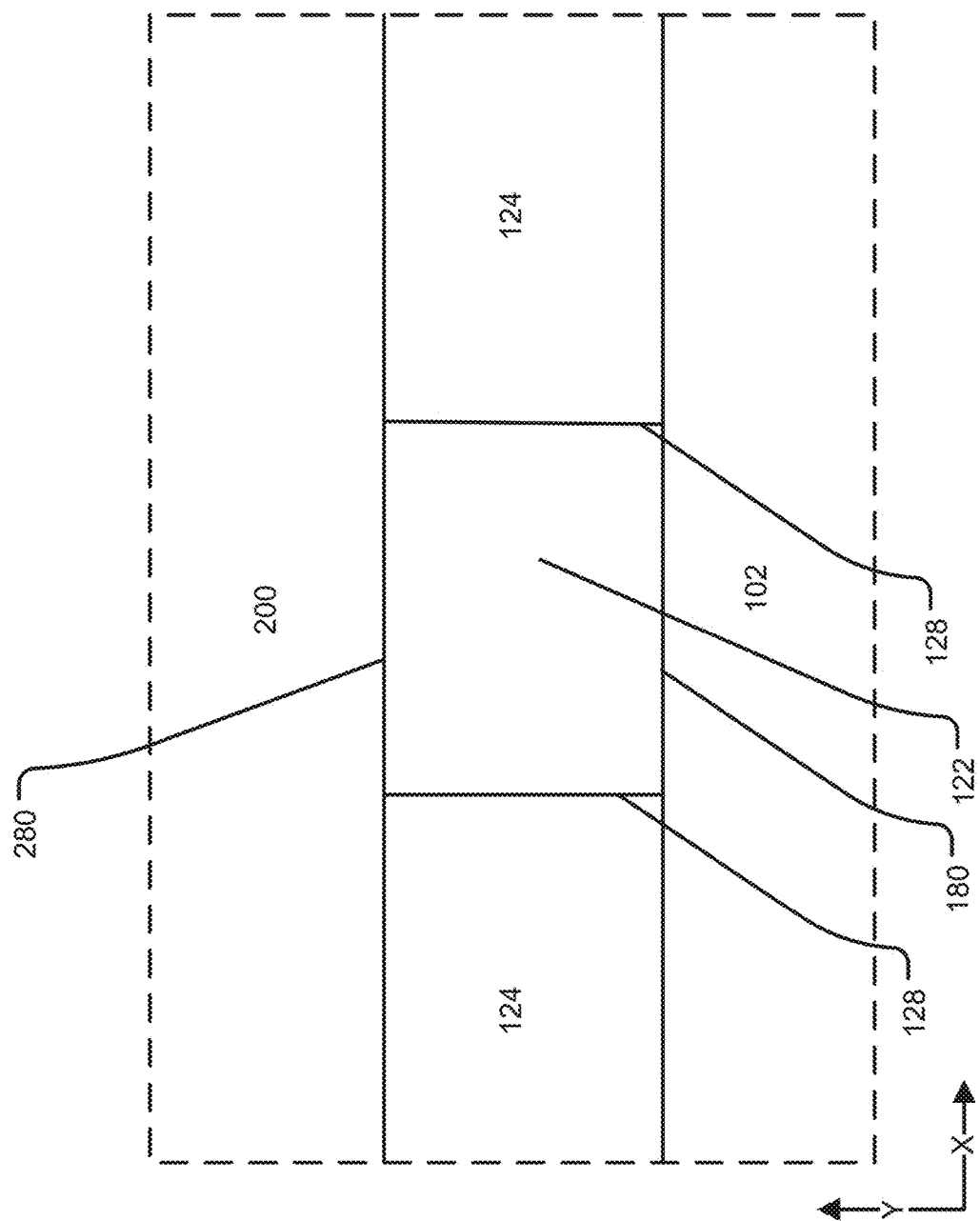

PACKAGED TRANSISTOR HAVING DIE ATTACH MATERIALS WITH CHANNELS AND PROCESS OF IMPLEMENTING THE SAME

CROSS-REFERENCE TO RELATED APPLICATIONS

This application is a continuation in part of U.S. patent application Ser. No. 16/868,639, filed May 7, 2020, issued as U.S. Pat. No. 11,424,177, which is incorporated herein by reference in its entirety. This application also claims the benefit of U.S. Provisional Application No. 63/055,541, filed on Jul. 23, 2020, which is hereby incorporated by reference in its entirety for all purposes as if fully set forth herein.

FIELD OF THE DISCLOSURE

The disclosure relates to a semiconductor die attach material with at least one channel. The disclosure further relates to a radio frequency (RF) package having a semiconductor die, such as a Group III-nitride based die, having die attach materials with at least one channel, including without limitation multiple, intersecting and/or different shaped channels or grooves, such as in a mesh configuration.

BACKGROUND OF THE DISCLOSURE

One of the primary modern die attach materials that replaces AuSn (gold tin solder) in low cost packaging is called Silver Sintered die attach material. The materials consist of tiny silver particles for 75-90% of the bulk mass, and volatile organics for the remainder. The materials are either dispensed from a needle, screenprinted or dispensed by inkjet. The die attach material provides a high thermal conductivity path to both dissipate high power through the material and also a strong mechanical bond to the package that the die is attached within. Once the material is dispensed or screenprinted onto a support, such as a leadframe or submount and a die is placed onto the material, it is subsequently cured and hardened. During the curing of such die attach materials made of metal particles and volatile organics, such as plastic, polymer or resin, the volatile organics outgas, that is to say they generate gas bubbles that become frozen in the die attach material as it hardens. For high power dissipation applications on a large area semiconductor die, such as a Group III-nitride based microwave monolithic integrated circuits or large area Group III-nitride based GaN HEMTs, the voids that form during curing or attachment process can be positioned under transistor portions of the semiconductor die and inhibit heat transfer away from the transistor. The locations of the generated gas is partially random, and since generally the sintered materials are viscous, there is minimal void aggregation or void bubbles that "escape" to the edge of the material before it fully hardens. Generally, the larger the semiconductor die, such as the generally larger MMICs, the higher the concentration of voids that can be found in the central area of the semiconductor die, which likely results in voids under the critical active transistor area.

Attaching the Group III-nitride based die, such as MMICs, to a support structure, such as a metal leadframe, metal flange or other suitable submount or support structure, is part of the packaging process. The package often includes protective material formed on or around the die and the protective material adheres to various portions of the die and/or support structure. However, the protective material may not reliably adhere to the various portions of the die and/or support structure, which may result in failure of the package. In particular, the protective packaging material, such as plastic, synthetic material or other suitable material, may not reliably adhere to various metal portions of the support.

Accordingly, what is needed is a device and process to limit void creation in die attach materials for semiconductor die. Additionally, what is needed is a device and process to improve adhesion of the protective materials of a package for semiconductor die.

SUMMARY OF THE DISCLOSURE

One aspect of the disclosure includes a semiconductor device that includes a semiconductor die; a support; and a die attach material include at least one channel, at least a portion of the at least one channel positioned between the semiconductor die and the support to allow gases generated during attachment of the semiconductor die to the support to be released from the die attach material.

One aspect of the disclosure includes a process of implementing a semiconductor device that includes providing a semiconductor die; providing a support; and forming a die attach material include at least one channel, at least a portion of the at least one channel positioned between the semiconductor die and the support to allow gases generated during attachment of the semiconductor die to the support to be released from the die attach material.

One aspect of the disclosure includes a semiconductor device that includes a semiconductor die that include at least one secondary device area; a support; and a die attach material include at least one channel, at least a portion of the at least one channel positioned between the at least one secondary device area of the semiconductor die and the support to allow gases generated during attachment of the semiconductor die to the support to be released from the die attach material.

One aspect of the disclosure includes a semiconductor device that includes a semiconductor die; a support; and a die attach material include at least one channel; and an over-mold configuration that at least surrounds the semiconductor die and the over-mold configuration is attached at least in part to the die attach material.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 4 illustrates a partial view of FIG. 3A.

DETAILED DESCRIPTION OF THE DISCLOSURE

Figure 1:
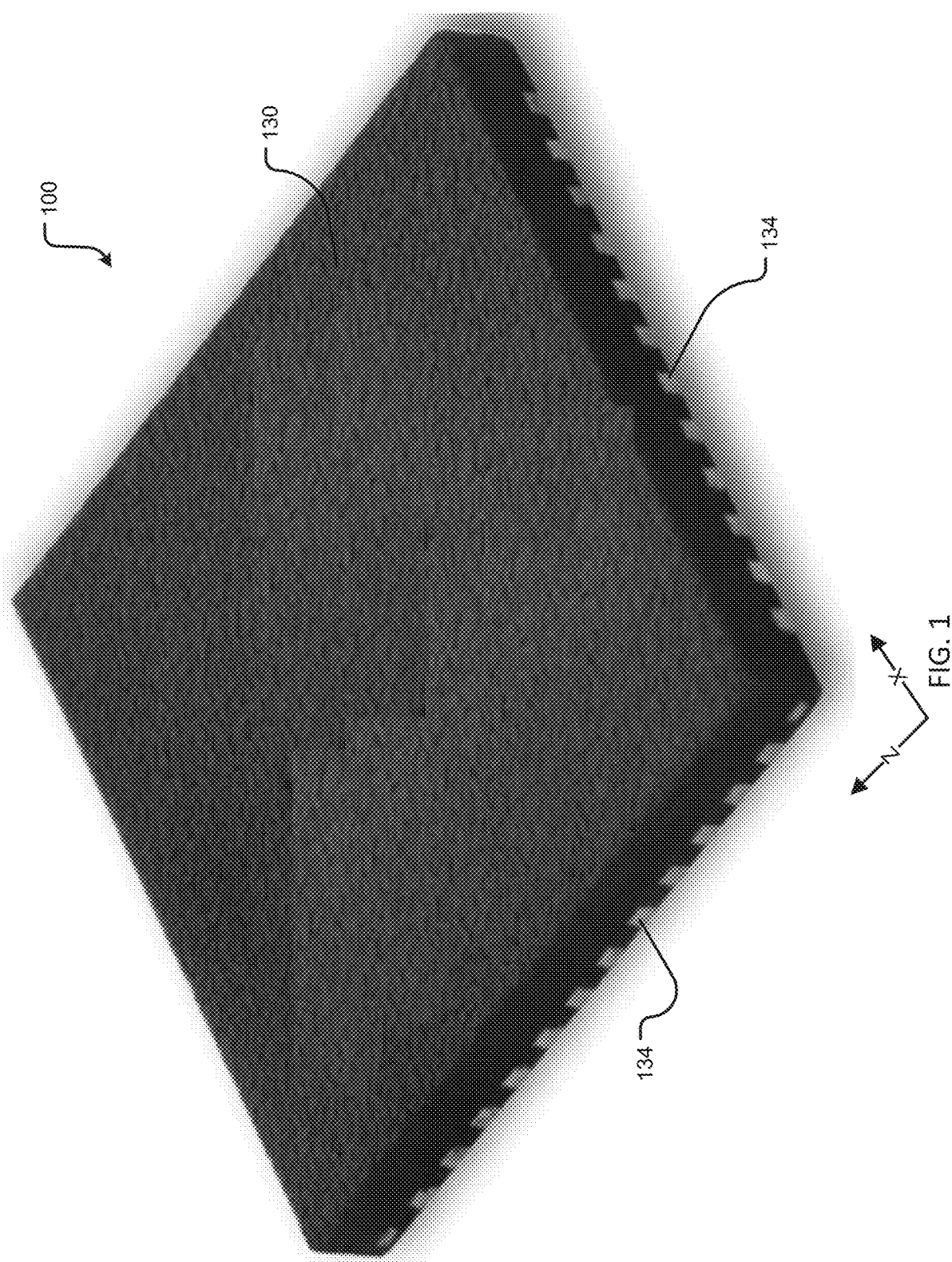
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects of the disclosure may be utilized in low cost packaging utilizing Silver Sintered die attach material. The material may include for example tiny silver particles for 75-90% of the bulk mass, and volatile organics for the remainder. The materials may be dispensed from a needle, screenprinted, dispensed by inkjet, and/or the like. The die attach material may provide a high thermal conductivity path to both dissipate high power through the material and also a strong mechanical bond to the package that the die is attached within. Once the material is dispensed, screen-printed, and/or the like onto a support, such as a leadframe, submount, and/or the like and a die is placed onto the material, it is subsequently cured and hardened. During the curing of such die attach materials made of metal particles and volatile organics, such as plastic, polymer or resin, the volatile organics outgas and may generate gas bubbles that could become frozen in the die attach material as it hardens.

For high power dissipation applications on a large area semiconductor die, such as a Group III-nitride based microwave monolithic integrated circuits or large area Group III-nitride based GaN HEMTs, the disclosure provides a number of configurations and processes to ensure at least a reduction in voids that form during a curing or attachment process positioned under transistor portions of the semiconductor die and inhibit heat transfer away from the transistor. The locations of the generated gas are partially random, and since generally the sintered materials are viscous, the disclosure utilizes implementations to encourage the bubbles to "escape" to the edge of the material before it fully hardens. Generally, the larger the semiconductor die, such as the generally larger MMICs, the more beneficial the various aspects of the disclosure may be in order to reduce and/or eliminate voids that can be found in the central area of the semiconductor die, which may be a critical active transistor area.

In certain embodiments, die attach materials comprise metal particles in an organic material, such as a sintered die attach material. In certain embodiments, the sintered die attach material is silver sintered die attach or copper sintered die attach material. This material may include tiny silver particles for a majority of the bulk mass, and volatile organics for the remainder. The materials may be dispensed from a needle, screen-printed, dispensed by inkjet, and/or the like. The die attach material provides a high thermal conductivity path to both dissipate high power through the die attach material and also a strong mechanical bond to the package that the die is attached within.

Once the die attach material is dispensed or screen-printed onto a substrate or a lead frame and a die is placed onto the die attach material, it is subsequently cured and hardened. During the curing, the volatile organics of the die attach material outgas. In particular, the volatile organics generate small gas bubbles whose shapes become frozen in the die attach material as it hardens. For high power dissipation applications on a large area integrated circuit, such as a monolithic integrated circuit, a monolithic microwave integrated circuit (MMIC), a multicelled transistor integrated circuit, an integrated circuit having an array of Field Effect Transistors (FETs), a multi-transistor integrated circuit, a multi-circuit integrated circuit, a multi-unit integrated circuit, a multi-area integrated circuit, a multi-active area integrated circuit, compound semiconductor devices, high-power compound semiconductor devices, high frequency compound semiconductor devices, and/or the like, it is important that the voids that form during curing do not form under an active portion, such as a transistor portion, of the integrated circuit. Likewise, with discrete devices, discrete transistors, larger form factor discrete transistors, larger form factor discrete devices, multi-area discrete devices, and/or the like it is important that the voids that form during curing do not form under an active portion, such as a transistor portion, of the discrete device. This is because the voids inhibit heat transfer away from the active area, such as an area implementing a transistor. Generally, the locations of the generated gas are partially random, and since the sintered materials are generally quite viscous, there is minimal void aggregation or void bubbles that "escape" to an edge of the die material before it fully hardens during curing. Generally, the larger the integrated circuit, the higher the concentration of voids. Moreover, a higher concentration of voids can be found in a central area of the integrated circuit. Such voids can be determined via x-ray.

In aspects, the disclosure relates to an intentionally constructed channel, for example constructed utilizing a screen printing stencil, that will allow for outgassing voids to escape in areas that are near but not directly under the active area such as an active transistor. It is noted that sintered materials, such as silver sintered materials, have quite different behavior than traditional solders. Accordingly, utilizing an application of a channeled void reduction technique as described in the disclosure using the sintered die attach materials provides unexpected results in improved cooling and/or robustness. Moreover, utilizing an application of a channeled void reduction technique as described in the disclosure for Group III-N nitride semiconductor die, such as GaN or alloys thereof based HEMTs and MMICs using the sintered die attach materials provides unexpected results in improved cooling and/or robustness. Furthermore, utilizing an application of a channeled void reduction technique as described in the disclosure for discrete devices, discrete transistors, larger form factor discrete transistors, larger form factor discrete devices, multi-area discrete devices, and/or the like using the sintered die attach materials provides unexpected results in improved cooling and/or robustness. In particular, Applicant has tested numerous different processes of reducing the voids and the disclosed channeled approach has been found to exhibit and provide the best results.

In the industry, silver sintered die attach materials have been used mostly to attach discrete transistors. Generally speaking, discrete transistors do not have the same void issues because they have a long and skinny form factor, for example a path of less 0.6 mm, which generally allows for any voids to escape to a free edge. As the industry has migrated to larger dies with higher power levels and more integration, and in particular towards more MMIC based implementations, the die attach voiding from the un-avoidable outgassing has become more of a problem. One way to address the problem would be to x-ray every device during production as a "screening" procedure and throw away any devices with appreciable voiding beneath the active transistor area. With the technique of the disclosure, voiding can be reduced to near zero under the active transistor area such that no "screening" is necessary. Therefore, the technique set forth by the disclosure has both yield improvement advantages in addition to its technology enablement applications for the low cost, high power GaN MMIC based solutions of today and the future. Additionally, the disclosed technique adds little or no additional processing or screening steps to production. While clearly advantageous in the context of the generally larger are MMICs, the present invention also can provide improved die attach for discrete transistors, such as Group III-nitride based HEMTs and the packaging thereof. In particular, the present invention also can provide improved die attach discrete devices, discrete transistors, larger form factor discrete transistors, larger form factor discrete devices, multi-area discrete devices, and/or the like.

There are numerous potential embodiments of this technique. In this regard, the disclosure describes processes and devices utilizing silver sintered die attach materials. However, the disclosed processes and devices may also be applicable to future die attach materials such as copper sintered materials currently being developed. Moreover, the disclosure sets forth a number of potential channel locations. However, the disclosure is not limited to these potential locations and any number of potential embodiments are contemplated as to where a channel may be laid and/or positioned. In particular aspects utilizing a monolithic integrated circuit, such as a MMIC, there may be long skinny portions of active areas, such as a transistor area, and large swaths of matching components such as resistors, capacitors, inductors, and/or the like that are collectively referred to as passive area. In particular aspects, the disclosure contemplates arranging a long thin channel under the passive area near the active area. In some aspects of the disclosure, a single channel may be arranged to one side of some active area, a channel may be arranged on both sides of an active area, and/or the like. In various aspects of the disclosure, the channels need not be straight. In particular, the channels may be angled, curved, and/or the like to provide targeted void reduction and avoid sensitive areas.

Additionally, the disclosure contemplates applying the die attach material to form the channels using screen-printing. However, the die attach material having channels may be implemented using other methods of die attach application such as needle dispensing, jet dispensing, and the like. Applicant has implemented the disclosed processes and devices and have found a number of beneficial applications. For example, the disclosed processes and devices have been implemented in GaN-on-SiC (silicon carbide) with the sintered die attach materials. However, it is believed that similar beneficial applications may be achieved for GaN-on-Si, LDMOS (laterally-diffused metal-oxide semiconductor), and/or the like utilizing sintered die attach materials. In particular, Applicant notes that in particular high-power applications may benefit from disclosed processes. For example, Applicant contemplates utilization of the processes of the disclosure with MMICs or any other disclosed device types made utilizing above-noted technologies. Additionally, Applicant notes that a custom stencil for screen printing sintered die attach materials containing an outgassing channel for various applications, such as a MMIC die attach, is very inexpensive.

The applications of the disclosure may relate to sintered die attach materials, such as sintered silver, sintered copper, and/or the like. It is expected that very little can be done to eliminate the generation of the gas voids. In this regard, the disclosure provides processes that allow an escape path or pre-defined gathering area for those voids to prevent them from forming and being sealed beneath the hot active area, such as a transistor area of the MMIC die, a multicelled transistor integrated circuit die, a die of an integrated circuit having an array of Field Effect Transistors (FETs), a die of a multi-transistor integrated circuit, a die of a multi-circuit integrated circuit, a die of a multi-unit integrated circuit, a die of a multi-area integrated circuit, a die of a multi-active area integrated circuit, compound semiconductor devices, high-power compound semiconductor devices, high frequency compound semiconductor devices, and/or the like. Additionally, the disclosure can also apply to discrete devices, discrete transistors, larger form factor discrete transistors, larger form factor discrete devices, multi-area discrete devices, and/or the like. However, the disclosed processes provide particular benefits in the die attach of integrated circuits, such as MMICs, since they utilize a much larger area and contain vast swaths of passive area.

FIG. 1 illustrates a perspective view of a package according to the disclosure.

Figure 2:
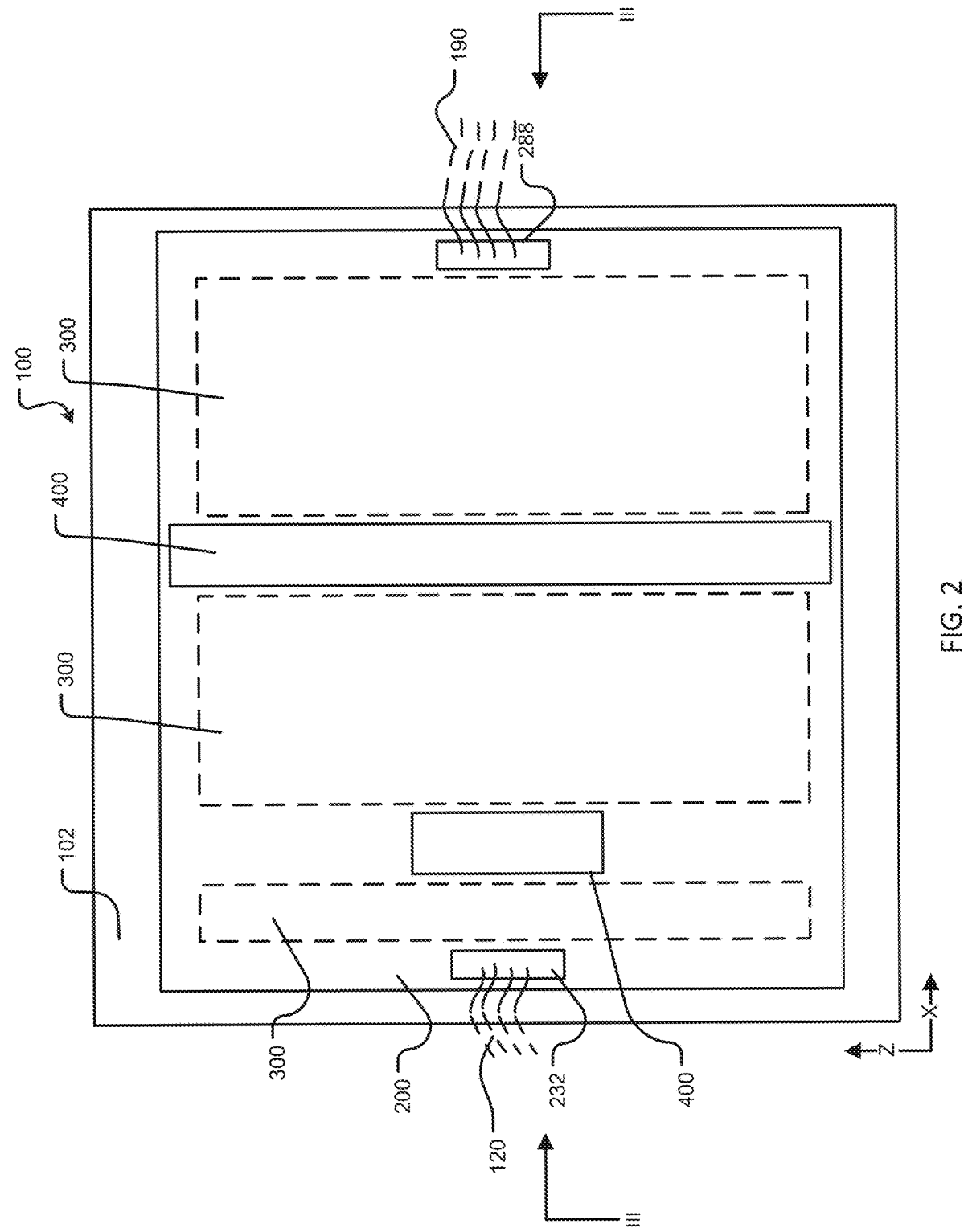
FIG. 2 illustrates a partial top view of the package according to FIG. 1.

FIG. 2 illustrates a partial top view of the package according to FIG. 1.

Figure 3A:
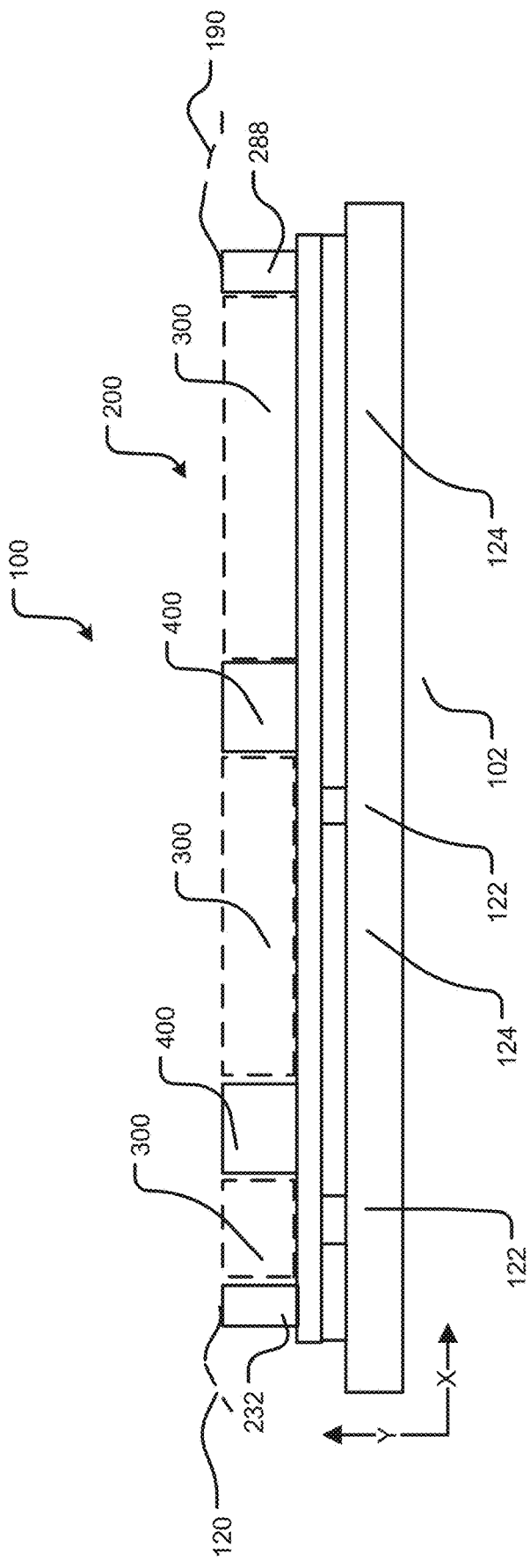
FIG. 3A illustrates a partial cross-sectional view of the package taken along lines III-III of FIG. 2.

FIG. 3A illustrates a partial cross-sectional view of the package taken along lines III-III of FIG. 2.

In particular, FIG. 1, FIG. 2, and FIG. 3A show an exemplary implementation of a package 100 that may include any one or more features, components, arrangements, and the like as described herein. In particular, FIG. 1, FIG. 2, and FIG. 3A show the package 100 that may be implemented as a power package, a power amplifier package, a microwave power package, a microwave power amplifier package, a Radio frequency (RF) package, a RF amplifier package, a RF power amplifier package, a RF power transistor package, a RF power amplifier transistor package, and/or the like as described herein. With reference to FIG. 1, the package 100 may include one or more input/output pins 134.

With reference to FIG. 2 and FIG. 3A, the package 100 may include a semiconductor die 200 having one or more active areas 400. In this regard, the package 100 illustrated in FIG. 2 and FIG. 3A show two of the one or more active areas 400. However, the package 100 may include any number of the one or more active areas 400. The semiconductor die 200 may be coupled to the one or more input/output pins 134 via one or more interconnects 120, one or more interconnects 190, and/or other connections.

The one or more interconnects 120 and/or the one or more interconnects 190 may utilize one or more wires, leads, vias, edge platings, circuit traces, tracks, ball bonding, wedge bonding, compliant bonding, ribbon bonding, metal clip attach, and/or the like. In one aspect, the one or more interconnects 120 and/or the one or more interconnects 190 may utilize the same type of connection. In one aspect, one or more interconnects 120 and/or the one or more interconnects 190 may utilize different types of connections.

The one or more interconnects 120 and/or the one or more interconnects 190 may be include various metal materials including one or more of aluminum, copper, silver, gold, and/or the like. In one aspect, one or more interconnects 120 and/or the one or more interconnects 190 may utilize the same type of metal. In one aspect, one or more interconnects 120 and/or the one or more interconnects 190 may utilize different types of metal.

One or more interconnects 120 and/or the one or more interconnects 190 may connect by an adhesive, soldering, sintering, eutectic bonding, thermal compression bonding, ultrasonic bonding/welding, a clip component, and/or the like as described herein. In one aspect, the connections may utilize the same type of connection. In one aspect, the connections may utilize different types of connections.

The one or more active areas 400 may be any area within the semiconductor die 200 that generates heat and/or may benefit from heat flux, heat transfer, cooling, and/or the like. The one or more active areas 400 may be an area that one or more transistors are located, an area that one or more transistor amplifiers are located, an area that one or more transformers are located, an area that one or more voltage regulators are located, an area that one or more devices that generate heat are located, an area that one or more devices that may benefit from lower temperature operation are located, an area that one or more semiconductor devices are located, and the like, and/or combinations thereof.

The one or more active areas 400 may be any area that one or more semiconductor devices are located. The one or more semiconductor devices may be a wide band-gap semiconductor device, an ultra-wideband device, a GaN based device, a GaN-on-SiC device, a GaN-on-Si device, a Metal Semiconductor Field-Effect Transistor (MESFET), a Metal Oxide Field Effect Transistor (MOSFET), a Junction Field Effect Transistor (JFET), a Bipolar Junction Transistor (BJT), laterally-diffused metal-oxide semiconductor (LDMOS), an Insulated Gate Bipolar Transistor (IGBT), a high-electron-mobility transistor (HEMT), a Wide Band Gap (WBG) semiconductor, Field Effect Transistor (FET), and the like, and/or combinations thereof.

The one or more semiconductor devices may implement an amplifier, a radar amplifier, radar components, a microwave radar amplifier, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like. The L band is the Institute of Electrical and Electronics Engineers (IEEE) designation for the range of frequencies in the radio spectrum from 1 to 2 gigahertz (GHz). The S band is a designation by the IEEE for a part of the microwave band of the electromagnetic spectrum covering frequencies from 2 to 4 GHz. The X band is the designation for a band of frequencies in the microwave radio region of the electromagnetic spectrum indefinitely set at approximately 7.0-11.2 GHz. The C-band is the designation given to the radio frequencies from 500 to 1000 MHz. The Ku band is the portion of the electromagnetic spectrum in the microwave range of frequencies from 12 to 18 GHz.

The semiconductor die 200 may further include at least one secondary device area 300. The at least one secondary device area 300 may be defined as a passive area. The at least one secondary device area 300 may be implemented as RF devices as described herein. The at least one secondary device area 300 may implement one or more of resistors, inductors, capacitors, Metal-Oxide-Silicon (MOS) capacitors, impedance matching circuits, matching circuits, input matching circuits, output matching circuits, intermediate matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, integrated passive devices (IPD), matching networks, and/or the like, and/or combinations thereof to support various functional technology as input, output, and/or intrastage functions to the package 100, and/or the like.

The package 100 may include a support 102. The support 102 may be implemented as a support, a surface, a package support, a package surface, a package support surface, a metal submount, a flange, a metal flange, a heat sink, a common source support, a common source surface, a common source package support, a common source package surface, a common source package support surface, a common source flange, a common source heat sink, a leadframe, a metal leadframe, and/or the like, and/or combinations thereof. The support 102 may include a metal material, an insulating material, a dielectric material, and the like, and/or combinations thereof. The support 102 may dissipate heat generated by the semiconductor die 200, the one or more active areas 400, the at least one secondary device area 300, and/or the like while simultaneously isolating and protecting the semiconductor die 200, the one or more active areas 400, and/or the like from the outside environment.

With reference to FIG. 3A, the semiconductor die 200 may be mounted on the support 102 using a die attach material 124. The die attach material 124 may include one or more channels 122. In particular, the one or more channels 122 may be located vertically below along the y-axis with respect to the one or more active areas 400, but not directly below the one or more active areas 400. In other words, the one or more channels 122 may be located vertically below along the y-axis with respect to the one or more active areas 400 and offset from the active area 400 along the x-axis as further described herein. In one or more aspects, the die attach material 124 may not form an electrical connection with the semiconductor die 200. More specifically, the die attach material 124 may be utilized exclusively for attachment of the semiconductor die 200 to the support 102. Accordingly, in this aspect, a bottom of the semiconductor die 200 does not have any electrical contacts. In one or more aspects, the die attach material 124 may form a single electrical connection with the semiconductor die 200. More specifically, the die attach material 124 may be utilized for a single electrical connection of the semiconductor die 200 to the support 102. Accordingly, in this aspect, a bottom of the semiconductor die 200 may form a single electrical connection.

The one or more channels 122 may be arranged under the at least one secondary device area 300. In particular aspects, the one or more channels 122 may be arranged directly under the at least one secondary device area 300 along the y-axis. For example, one or more channels 122 may be arranged under or directly under the at least one secondary device area 300, a flux pad, and/or the like along the y-axis and the x-axis.

The die attach material 124 may include one or more metal materials and one or more non-metal materials. The one or more metal materials may include silver, copper, gold, tin, lead, and the like, and/or combinations thereof. The one or more metal materials may include a powdered metal material configured to be sintered. In one aspect, the die attach material 124 may include metal particles for 75%-90% of the bulk mass as the metal material, and the remainder may be the non-metal material. In one aspect, the die attach material 124 includes a sintered material. In one aspect, the die attach material 124 includes at least one of a silver sintered or copper sintered material.

The one or more non-metal materials may include organic materials, volatile organic materials, epoxy-based materials, epoxy, binder materials, gas generating materials, and the like, and/or combinations thereof. In one aspect, the die attach material 124 may include silver, silver configured to be sintered, a silver sintered material, and the like, and/or combinations thereof. In one aspect, the die attach material 124 may include silver particles for 75%-90% of the bulk mass as the metal material, and the remainder the non-metal material. In one aspect, the die attach material 124 may include silver particles for 75%-90% of the bulk mass as the metal material, and volatile organics for the remainder of the non-metal material.

Additionally, inside the package 100, the semiconductor die 200 may be arranged on the support 102. With reference to FIG. 1, the package 100 may include an overmold 130, and/or the like. The overmold 130 may substantially surround the semiconductor die 200, the one or more active areas 400, and/or the other components of the package 100. The overmold 130 may be formed of a plastic material, a mold compound, a synthetic material, a plastic polymer compound, and the like, and/or combinations thereof, which may be injection molded or compression molded around the support 102 and the semiconductor die 200, thereby providing protection from the outside environment.

Alternatively, the package 100 may be implemented to include an open cavity configuration suitable for use with the semiconductor die 200. In particular, the open cavity configuration may utilize an open cavity package design. In some aspects, the open cavity configuration may include a lid or other enclosure for protecting interconnects, circuit components, the semiconductor die 200, and/or the like. The package 100 may include a ceramic body, a lid, and/or one or more metal contacts.

The package 100 may be implemented as a MMIC RF package and may house RF devices. The RF devices may be configured and implemented at least in part in the at least one secondary device area 300. In particular, the RF devices may be configured and implemented in the at least one secondary device area 300 and may implement one or more of resistors, inductors, capacitors, Metal-Oxide-Silicon (MOS) capacitors, impedance matching circuits, matching circuits, input matching circuits, output matching circuits, intermediate matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, integrated passive devices (IPD), matching networks, and the like to support various functional technology as input, output, and/or intrastage functions to the package 100, and/or the like. The package 100 implemented as a MMIC package may further include the one or more active areas 400. The package 100 implemented as a MMIC package may further implement the one or more active areas 400 and the at least one secondary device area 300 configured to include, connect, support, or the like a radar transmitter, radar transmitter functions, a microwave radar transmitter, microwave radar transmitter functions, a radar receiver, radar receiver functions, a microwave radar receiver, microwave radar receiver functions, and/or the like.

The package 100 may be implemented as an a power package, a power amplifier package, a microwave power package, a microwave power amplifier package, a Radio frequency (RF) package, a RF amplifier package, a RF power amplifier package, a RF power transistor package, a RF power amplifier transistor package, and/or the like and the at least one secondary device area 300 and the one or more active areas 400 may be implemented as a radio frequency device and may include, connect, support, or the like a transmitter, transmitter functions, a receiver, receiver functions, a transceiver, transceiver functions, matching network functions, harmonic termination circuitry, integrated passive devices (IPD), and the like, and/or combinations thereof as described herein. The at least one secondary device area 300 implemented as a radio frequency device and/or the one or more active areas 400 may be configured to, may support, or the like transmitting a radio wave and modulating that wave to carry data with allowable transmitter power output, harmonics, band edge requirements, and the like, and/or combinations thereof as described herein. The at least one secondary device area 300 implemented as a radio frequency device and/or the one or more active areas 400 may be configured to, may support, or the like receiving a radio wave and demodulating the radio wave. The at least one secondary device area 300 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

Figure 3B:
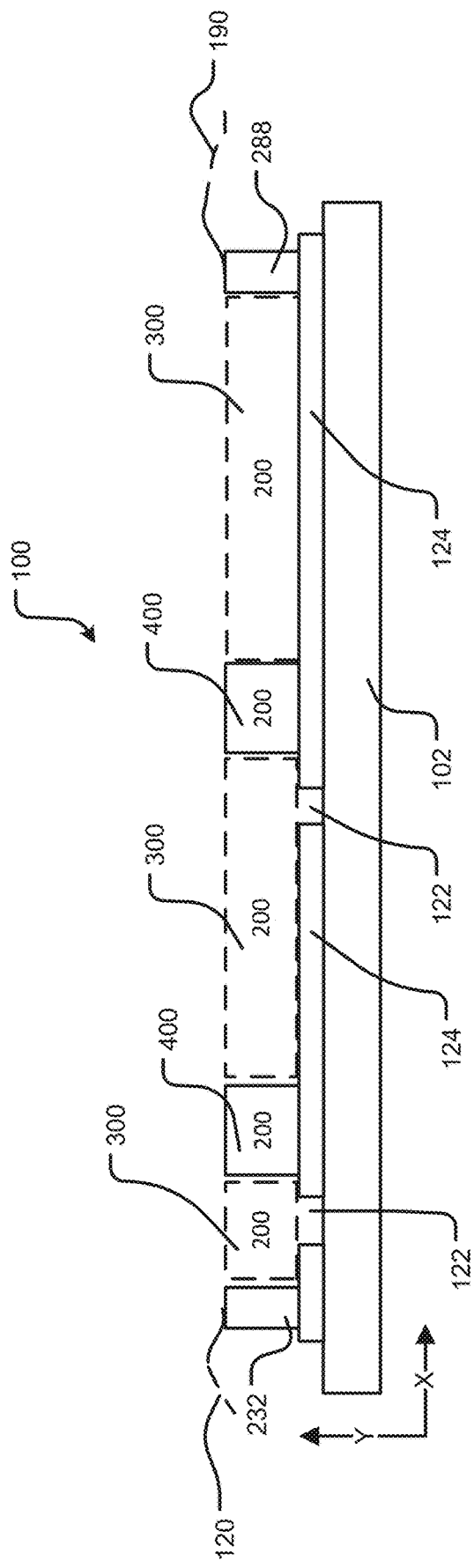
FIG. 3B illustrates a partial cross-sectional view of another aspect of FIG. 3A.

FIG. 3B illustrates a partial cross-sectional view of another aspect of FIG. 3A.

In particular, FIG. 3B illustrates an implementation of the package 100 implementing a plurality of the semiconductor die 200. Each of the various aspects, configurations, components, processes, and/or the like as described herein may be implemented in conjunction with the FIG. 3B implementation. With further reference to FIG. 3B, one or more of the semiconductor die 200 may be configured to be implemented as an implementation of the at least one secondary device area 300; and one or more of the semiconductor die 200 may be configured to be implemented as an implementation of the active area 400. In particular aspects, one or more of the plurality of the semiconductor die 200 may be implemented as discrete devices. In particular aspects, each of the plurality of the semiconductor die 200 may be implemented as discrete devices.

With reference to FIG. 3B, the plurality of the semiconductor die 200 may be mounted on the support 102 using the die attach material 124. The die attach material 124 may include the one or more channels 122. In particular, the one or more channels 122 may be located vertically below along the y-axis with respect to the semiconductor die 200 implemented as the one or more active areas 400, but not directly below the one or more active areas 400. In other words, the one or more channels 122 may be located vertically below along the y-axis with respect to the semiconductor die 200 implemented as the one or more active areas 400 and offset from the active area 400 along the x-axis as further described herein.

With further reference to FIG. 3B, the one or more channels 122 may be arranged under the semiconductor die 200 implemented as the at least one secondary device area 300. In particular aspects, the one or more channels 122 may be arranged directly under the semiconductor die 200 implemented as the at least one secondary device area 300 along the y-axis. For example, one or more channels 122 may be arranged under or directly under the semiconductor die 200 implemented as the at least one secondary device area 300, a flux pad, and/or the like along the y-axis and the x-axis.

FIG. 4 illustrates a partial view of FIG. 3A.

Figure 5:
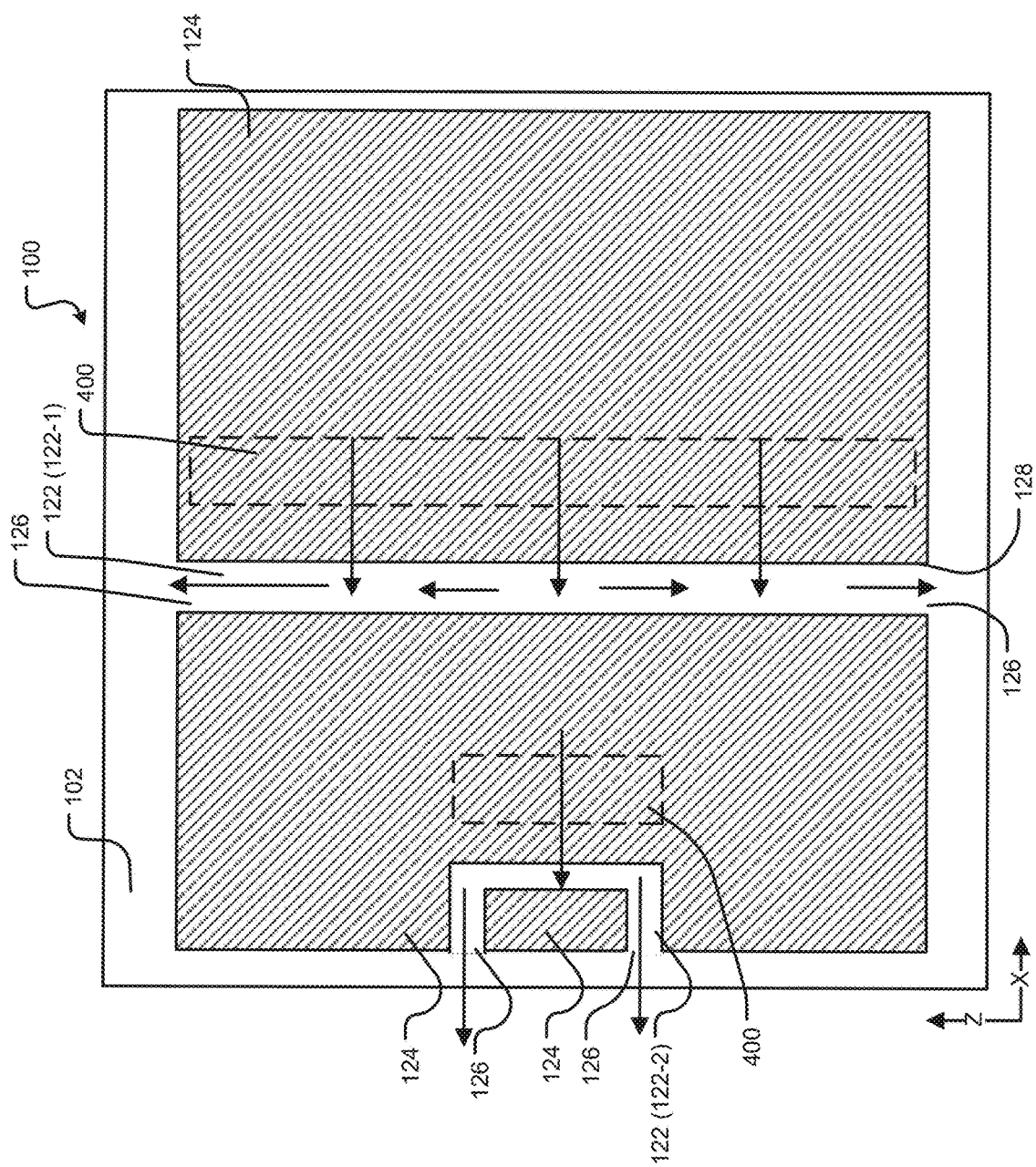
FIG. 5 illustrates an exemplary layout of die attach material according to the disclosure.

FIG. 5 illustrates an exemplary layout of die attach material according to the disclosure.

In particular, FIG. 4 illustrates a detailed view of the one or more channels 122 illustrated in FIG. 3A and applicable to any aspect described herein. With reference to FIG. 4, the one or more channels 122 may be defined by a lower surface 280 of the semiconductor die 200 and an upper surface 180 of the support 102. In one aspect, the lower surface 280 of the semiconductor die 200 may extend generally parallel to the X axis as illustrated in FIG. 4; the upper surface 180 of the support 102 may extend generally parallel to the X axis as illustrated in FIG. 4; and the one or more side edges 128 may extend generally parallel to the Y axis as illustrated in FIG. 4. In this regard, generally parallel may be defined to be within 0°-15°, 0°-2°, 2°-4°, 4°-6°, 6°-8°, 8°-10°, 10°-12°, or 12°-15°. In other aspects, the one or more channels 122 may be constructed and defined by other components of the package 100.

However, during manufacturing of the package 100, the one or more channels 122 may change shape, such as bulge, move, and/or the like. Accordingly, the various implementations of the one or more channels 122 as described herein may slightly vary during manufacturing.

FIG. 5 illustrates an exemplary arrangement of the die attach material 124 arranged on the support 102. In particular, the die attach material 124 may include the one or more channels 122. The one or more channels 122 may be located vertically below along the y-axis the one or more active areas 400 (shown by dashed lines in FIG. 5), but not directly below the one or more active areas 400. In other words, the one or more channels 122 may be located vertically below along the y-axis with respect to the one or more active areas 400 and offset with respect to the active area 400 along the x-axis.

The one or more channels 122 may be arranged under the at least one secondary device area 300. In particular aspects, the one or more channels 122 may be arranged directly under the at least one secondary device area 300 along the y-axis. For example, one or more channels 122 may be arranged under or directly under the at least one secondary device area 300, a flux pad, and/or the like along the y-axis and the x-axis.

The one or more channels 122 may include one or more exhaust vents 126 and the one or more side edges 128. The one or more channels 122 may be within a plane of the x-axis and z-axis parallel to the upper surface 180 of the support 102 and may be rectangular in shape, polygonal in shape, circular in shape, freeform in shape, continuous in shape, discontinuous in shape, and the like, and/or combinations thereof.

The one or more channels 122 may dissect the die attach material 124 within a plane of the x-axis and z-axis parallel to the upper surface 180 of the support 102. As illustrated in FIG. 5, there are two of the one or more channels 122 that dissect the die attach material 124 into three different sections. The package 100 may include any number of the one or more channels 122 and any number of sections of the die attach material 124.

The one or more side edges 128 of the one or more channels 122 may form a surface of the die attach material 124 that allows the gases generated during curing of the die attach material 124 to be released from the die attach material 124. In particular, the one or more channels 122 may form a surface utilizing the one or more side edges 128 of the die attach material 124 that allows the gases generated during curing to be released from the die attach material 124 from under the active area 400. More specifically, as shown by the arrows located partially in the die attach material 124 as illustrated in FIG. 5, gases generated during curing under the active area 400 may propagate toward the one or more side edges 128 of the one or more channels 122 and into the one or more channels 122. Accordingly, the one or more channels 122 in conjunction with the one or more side edges 128 help to reduce the formation of voids from under the active area 400 by providing a location to which gases generated during the curing process may escape from under the active area 400 and into the one or more channels 122.

Thereafter, the gases generated during curing under the active area 400 may enter the one or more channels 122. Once the gases are in the one or more channels 122, the gases may travel along the one or more channels 122 and exit from the one or more channels 122 through the exhaust vents 126 as shown by the arrows located within the one or more channels 122 as illustrated in FIG. 5.

In this regard, the one or more channels 122 allow gases generated during curing under the active area 400 to be released and reduce formation of voids from under the active area 400. Accordingly, the one or more channels 122 increases the cooling capability of the support 102 below the active area 400 by increasing the ability of heat generated by the active area 400 to be transferred from the semiconductor die 200 to the support 102. Additionally, implementation of the one or more channels 122 within the die attach material 124 may be even more beneficial to address various temperature extremes that may be more likely in high power applications of the package 100. In this regard, it is highly beneficial to maintain the active area 400 within 5° C. of a desired operating temperature range to ensure higher performance, high reliability, and/or the like.

With further reference to FIG. 5, the one or more channels 122 may have generally straight and/or linear constructions 122-1. The generally straight and/or linear constructions 122-1 may include a first one of the exhaust vents 126 at one end and a second one of the exhaust vents 126 at the other end. However, the generally straight and/or linear constructions 122-1 may include only one of the exhaust vents 126 at one end.

The one or more channels 122 may have multiple connected segments of generally straight and/or linear constructions 122-2. Each of the segments may be connected at any angle. The angle may include 1°-359°, 1°-40°, 40°-80°, 80°-120°, 120°-160°, 160°-200°, 200°-240°, 240°-280°, 280°-320°, or 320°-359°. As illustrated in FIG. 5, the multiple connected segments of generally straight and/or linear constructions 122-2 are connected generally at 90° angles. Additionally, the multiple connected segments of generally straight and/or linear constructions 122-2 may include a first one of the exhaust vents 126 at one end and a second one of the exhaust vents 126 at the other end. However, the multiple connected segments of generally straight and/or linear constructions 122-2 may include only one of the exhaust vents 126 at one end.

The one or more channels 122 may increase robustness of the die attach material 124, increase a lifetime of the die attach material 124, and/or other beneficial improvements. In this regard, larger area die attach regions have been found to suffer from various failure mechanisms such as delamination, cracking, and/or the like. The various failure mechanisms may be a result of thermal expansion of the materials associated with the die attach material 124, the semiconductor die 200, the support 102, and/or the like. In this regard, the materials associated with the die attach material 124, the semiconductor die 200, the support 102, and/or the like may be different materials and may have different coefficients of thermal expansion. Accordingly, the different materials that may have different coefficients of thermal expansion may result in differing expansion when the semiconductor die 200 is operated at various temperature extremes. This results in an increased likelihood of the package 100, the semiconductor die 200, the die attach material 124, and/or the like experiencing one of the failure mechanisms.

The one or more channels 122 may reduce the larger area die attach region. In particular, the one or more channels 122 may break up the larger area die attach region into one or more smaller area die attach regions. In particular, as illustrated in FIG. 5, there are two of the one or more channels 122 that dissect the die attach material 124 into three different smaller sections. Accordingly, the different materials that may have different coefficients of thermal expansion that may result in differing expansion when the semiconductor die 200 is operated at various temperature extremes may have a reduced amount of expansion due to the smaller sections of the die attach material 124. This results in a decreased likelihood of the package 100 experiencing one of the failure mechanisms.

The die attach material 124 may be applied utilizing screen-printing processes, preform processes, needle dispensing systems, inkjet dispensing systems, masking processes, photoengraving processes, print onto transparent film processes, photo mask processes in combination with etching processes, photo-sensitized processes, laser resist ablation processes, milling processes, laser etching processes, direct metal printing processes, combinations thereof, and/or like processes.

In one aspect, the die attach material 124 may be applied utilizing screen-printing processes. In this regard, a stencil may be formed having openings consistent with the various formations of the die attach material 124; and the stencil may be formed having portions not allowing application of the die attach material 124 consistent with various locations of the one or more channels 122. Thereafter, the stencil may be applied to the upper surface 180 of the support 102 and the die attach material 124 may be applied to the stencil. A squeegee may be applied across the stencil to force the die attach material 124 through the stencil onto the upper surface 180 of the support 102 to form the die attach material 124 and the one or more channels 122.

In one aspect, the die attach material 124 may be formed utilizing preform processes. In this regard, a preform may be formed consistent with the various formations of the die attach material 124; and the preform may be formed having portions where there is no part of the die attach material 124 consistent with various locations of the one or more channels 122. Thereafter, the preform may be applied to the upper surface 180 of the support 102 to form the die attach material 124 and the one or more channels 122.

In one aspect, the die attach material 124 may be applied utilizing needle dispensing systems. In this regard, the needle dispensing systems may be configured and operated to apply the die attach material 124 to the upper surface 180 of the support 102; and the needle dispensing systems may be configured and operated to not apply the die attach material 124 to the upper surface 180 of the support 102 consistent with various locations of the one or more channels 122.

In one aspect, the die attach material 124 may be applied utilizing inkjet dispensing systems. In this regard, the inkjet dispensing systems may be configured and operated to apply the die attach material 124 to the upper surface 180 of the support 102; and the inkjet dispensing systems may be configured and operated to not apply the die attach material 124 to the upper surface 180 of the support 102 consistent with various locations of the one or more channels 122.

In one aspect, the die attach material 124 may be applied utilizing masking processes. In this regard, a mask may be formed having openings consistent with the various formations of the die attach material 124; and the mask may be formed having portions not allowing application of the die attach material 124 consistent with various locations of the one or more channels 122.

Figure 6:
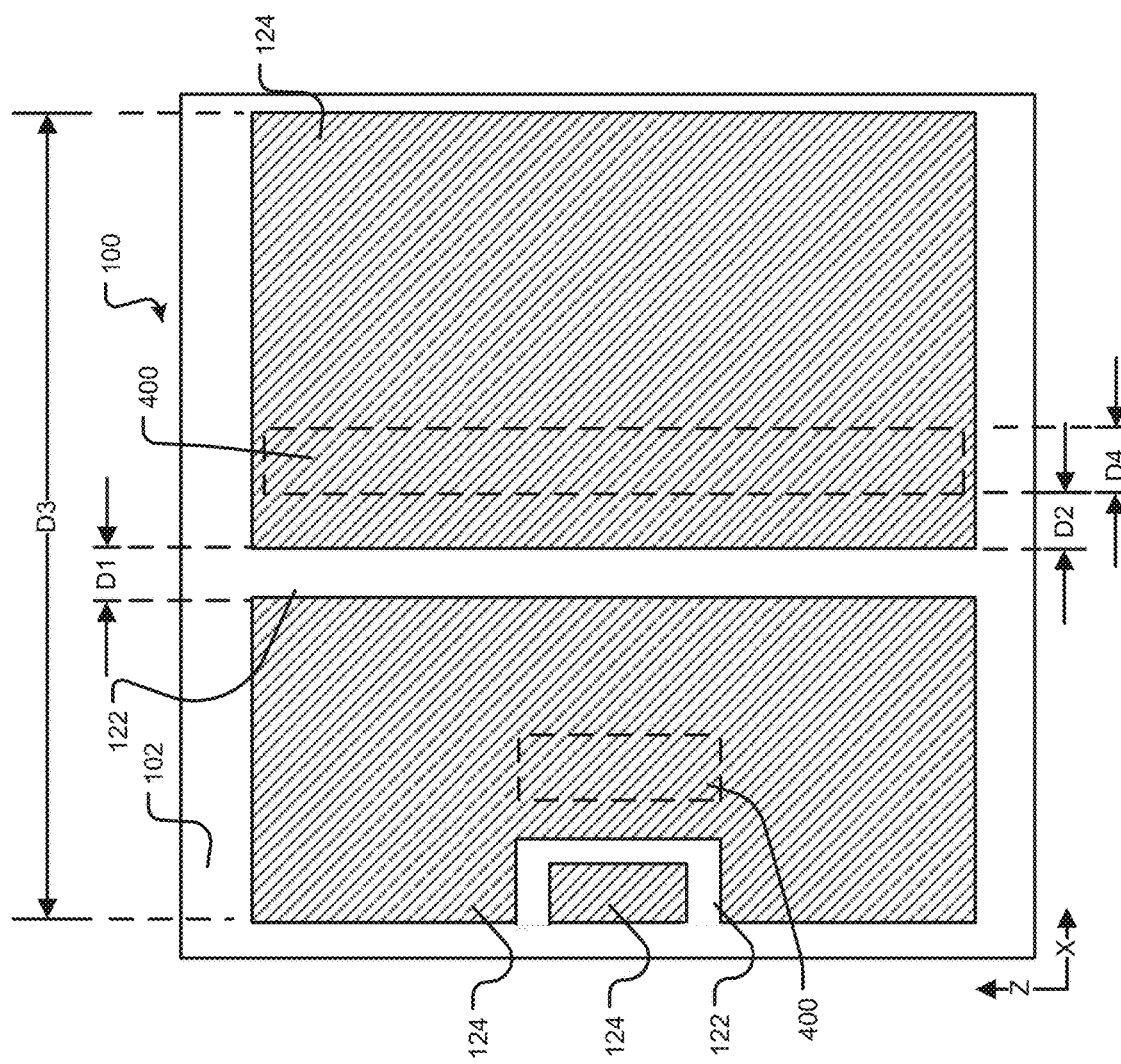
FIG. 6 illustrates various exemplary dimensions of channels of the die attach material according to the disclosure.

FIG. 6 illustrates various exemplary dimensions of channels of the die attach material according to the disclosure.

In particular, a location of the one or more channels 122 with respect to the active area 400 may be optimized for ensuring maximum heat transfer from the active area 400 to the support 102. Additionally, the location of the one or more channels 122 with respect to the active area 400 may be optimized for ensuring maximum reduction of voids and/or outgassing of the gas generated from the curing process from below the active area 400. More specifically, a width of the one or more channels 122 is illustrated and defined as being distance D1 along the x-axis; a distance from the active area 400 to the one or more channels 122 is defined as being a distance D2 along the x-axis; a length of the entire portion of the die attach material 124 is defined as a distance D3 along the x-axis; and a width of the active area 400 is defined as a distance D4 along the x-axis.

For example, the distance D1 may relate to the distance D2 as a relationship of a width of the one or more channels 122 to a distance from the one or more side edges 128 of the one or more channels 122 to an edge of the active area 400. The distance D1 may be 20%-300% of the distance D2, 20%-60% of the distance D2, 60%-100% of the distance D2, 100%-140% of the distance D2, 140%-180% of the distance D2, 180%-220% of the distance D2, 220%-260% of the distance D2, or 260%-300% of the distance D2.

For example, the distance D1 may relate to the distance D4 as a relationship of a width of the one or more channels 122 to a width of the active area 400. The distance D1 may be 20%-300% of the distance D4, 20%-60% of the distance D4, 60%-100% of the distance D4, 100%-140% of the distance D4, 140%-180% of the distance D4, 180%-220% of the distance D4, 220%-260% of the distance D4, or 260%-300% of the distance D4.

For example, the distance D1 may relate to the distance D3 as a relationship of a width of the one or more channels 122 to a width of the die attach material 124. The distance D1 may be 2%-40% of the distance D3, 2%-10% of the distance D3, 10%-20% of the distance D3, 20%-30% of the distance D3, or 30%-40% of the distance D3.

The various distances D1, D2, D3, and D4 may likewise be defined along the z-axis for configurations of the one or more channels 122, the active area 400, and/or the like formed along the z-axis.

Figure 7:
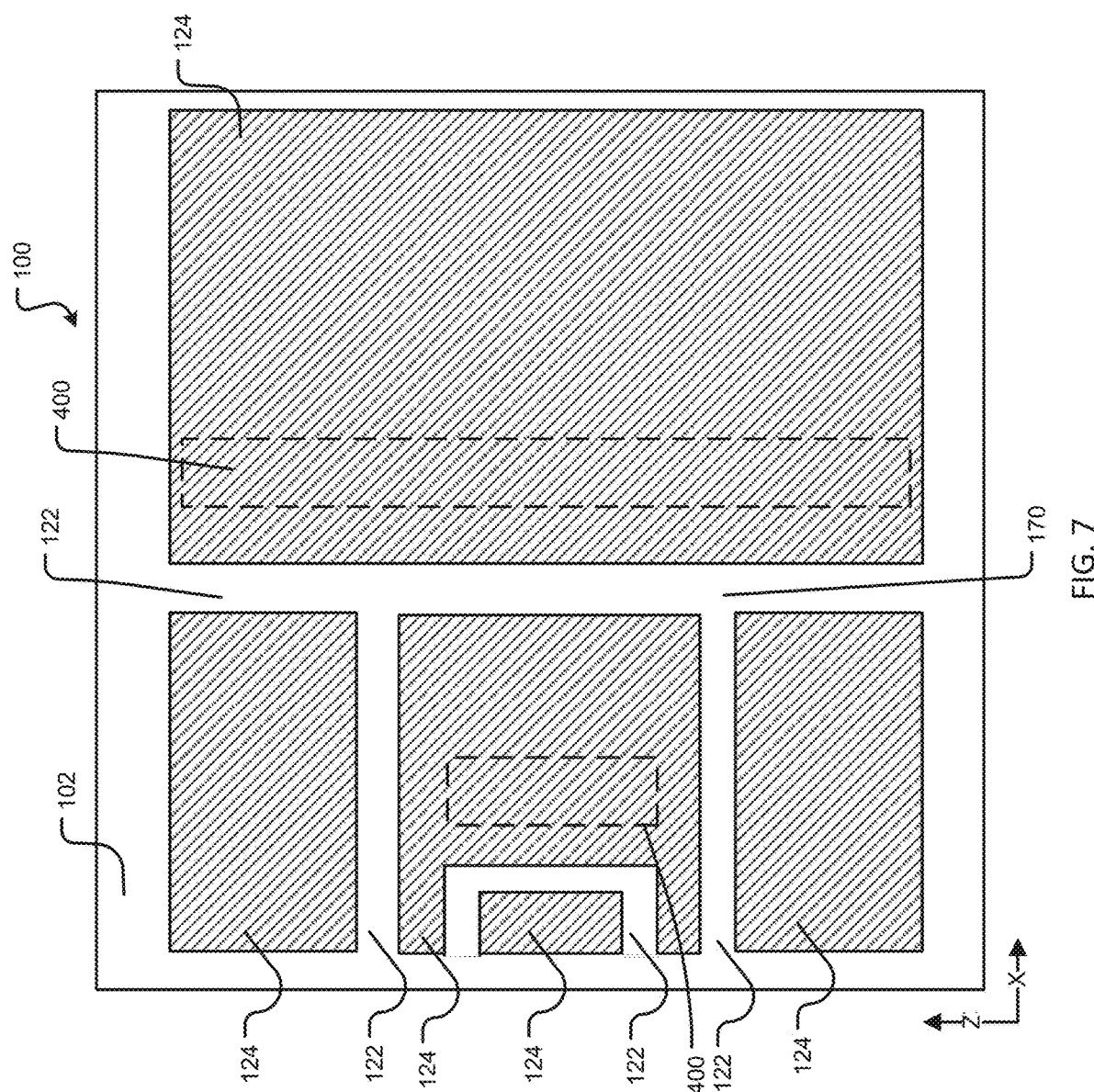
FIG. 7 illustrates an exemplary layout of die attach material according to the disclosure.

FIG. 7 illustrates an exemplary layout of die attach material according to the disclosure.

In particular, FIG. 7 illustrates alternative implementations of the one or more channels 122 forming numerous portions of the die attach material 124. Each of the various aspects, configurations, components, processes, and the like as described herein may be implemented in conjunction with the FIG. 7 layout. As illustrated in FIG. 7, various implementations of the one or more channels 122 may connect to form the various portions of the die attach material 124 as illustrated in FIG. 7. In this regard, the one or more channels 122 may connect to form intersections 170. In one aspect, the one or more channels 122 includes multiple channels. In one aspect, the one or more channels 122 includes at least two channels that intersect. In one aspect, the one or more channels 122 includes more than two channels intersect. In one aspect, the one or more channels 122 may form a mesh of channels.

Figure 8:
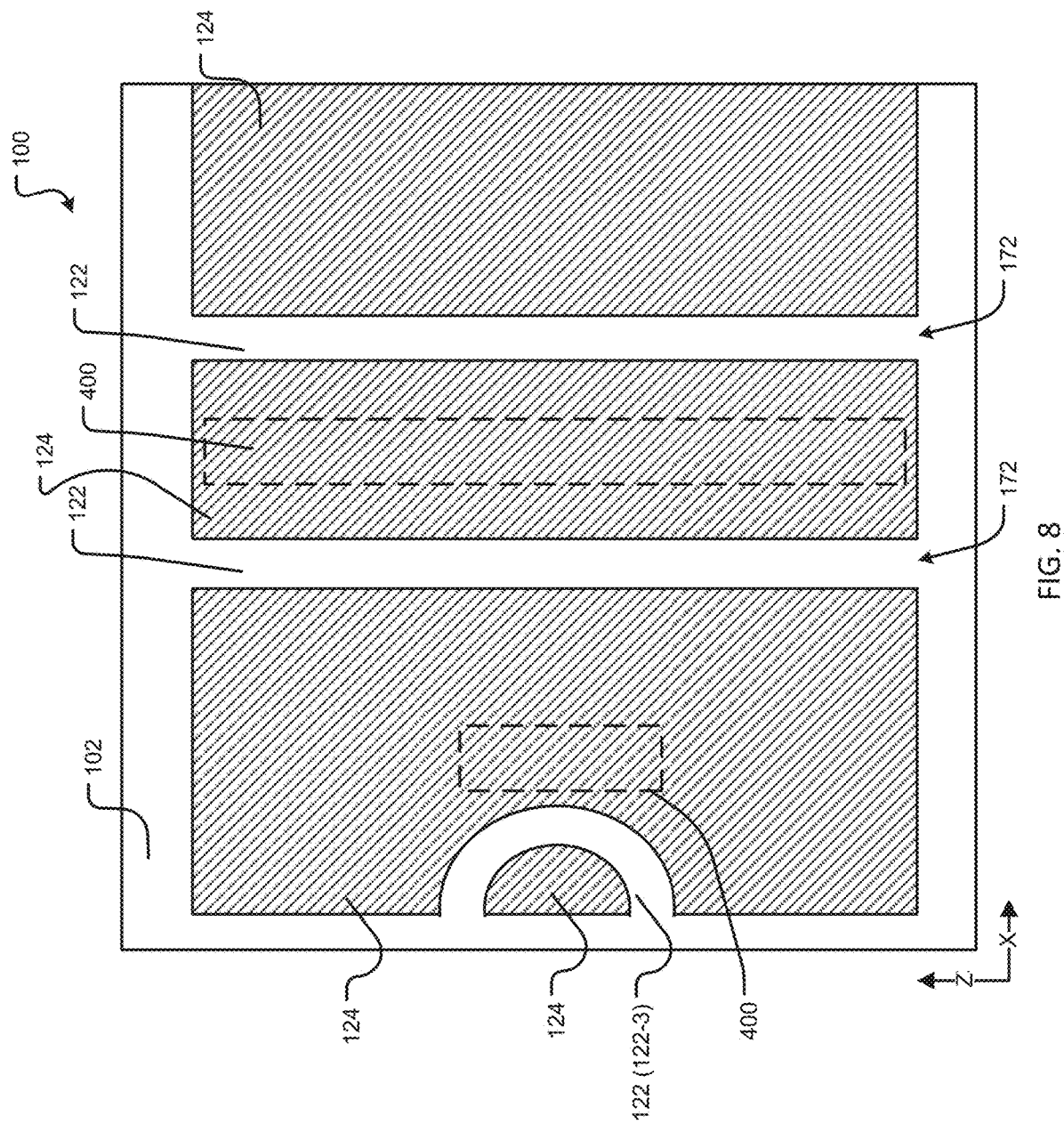
FIG. 8 illustrates an exemplary layout of die attach material according to the disclosure.

FIG. 8 illustrates an exemplary layout of die attach material according to the disclosure.

In particular, FIG. 8 illustrates alternative implementations of the one or more channels 122 forming numerous portions of the die attach material 124. Each of the various aspects, configurations, components, processes, and the like as described herein may be implemented in conjunction with the FIG. 8 layout. As illustrated in FIG. 8, various implementations of the one or more channels 122 may be arranged on both sides 172 of the one or more active areas 400 to form the various portions of the die attach material 124 as illustrated in FIG. 8. Additionally, FIG. 8 illustrates the one or more channels 122 having a curved construction 122-3.

Figure 9:
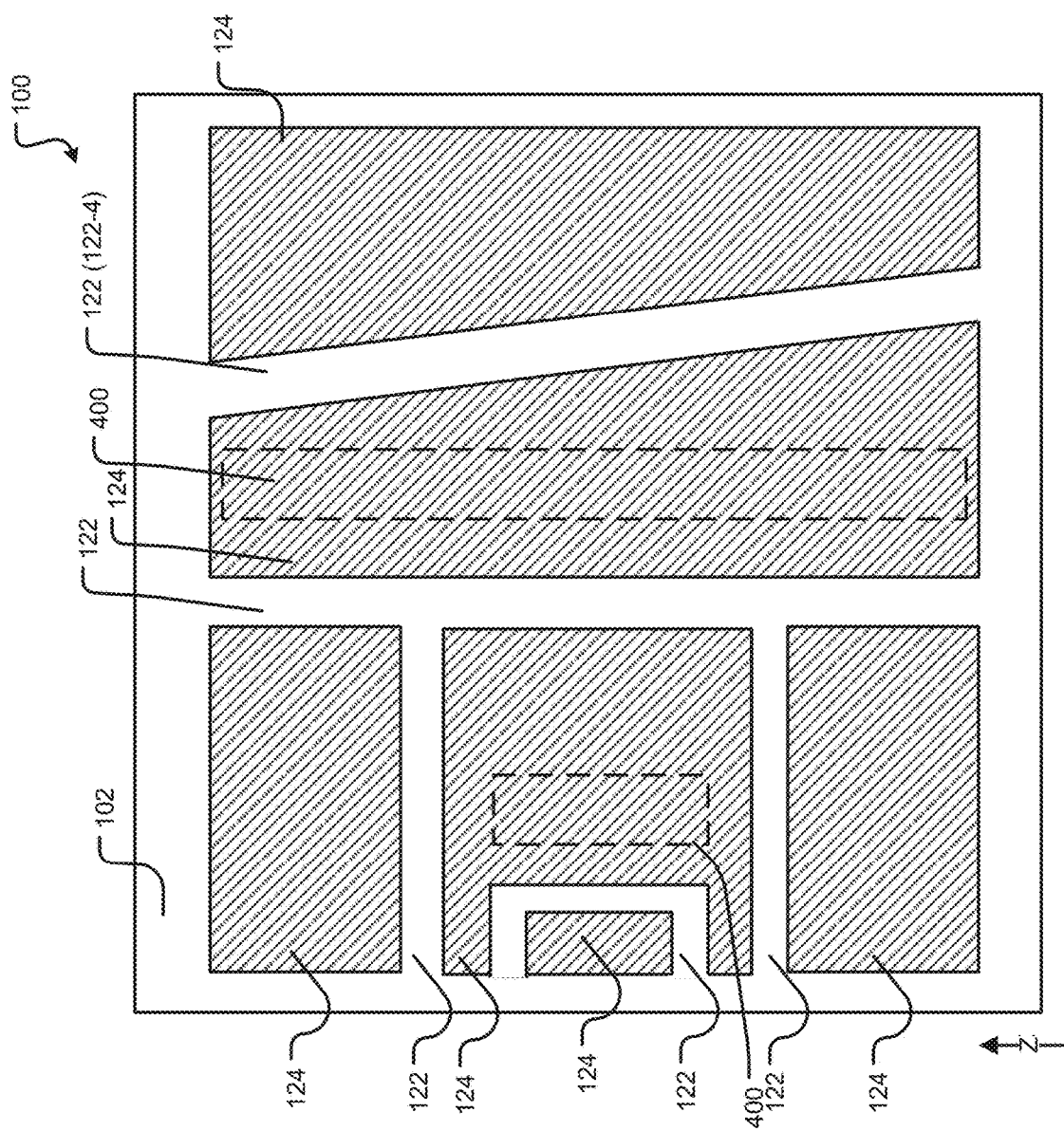
FIG. 9 illustrates an exemplary layout of die attach material according to the disclosure.

FIG. 9 illustrates an exemplary layout of die attach material according to the disclosure.

In particular, FIG. 9 illustrates alternative implementations of the one or more channels 122 forming numerous portions of the die attach material 124. Each of the various aspects, configurations, components, processes, and the like as described herein may be implemented in conjunction with the FIG. 9 layout. As illustrated in FIG. 9, various implementations of the one or more channels 122 may connect to form the various portions of the die attach material 124 as illustrated in FIG. 9. Additionally, FIG. 9 illustrates alternative implementations of the one or more channels 122 having a construction 122-4 that is angled with respect to both the z-axis and the x-axis. In one aspect, the one or more channels 122 includes multiple channels. In one aspect, the one or more channels 122 includes at least two channels that intersect. In one aspect, the one or more channels 122 includes more than two channels intersect. In one aspect, the one or more channels 122 may form a mesh of channels.

Figure 10:
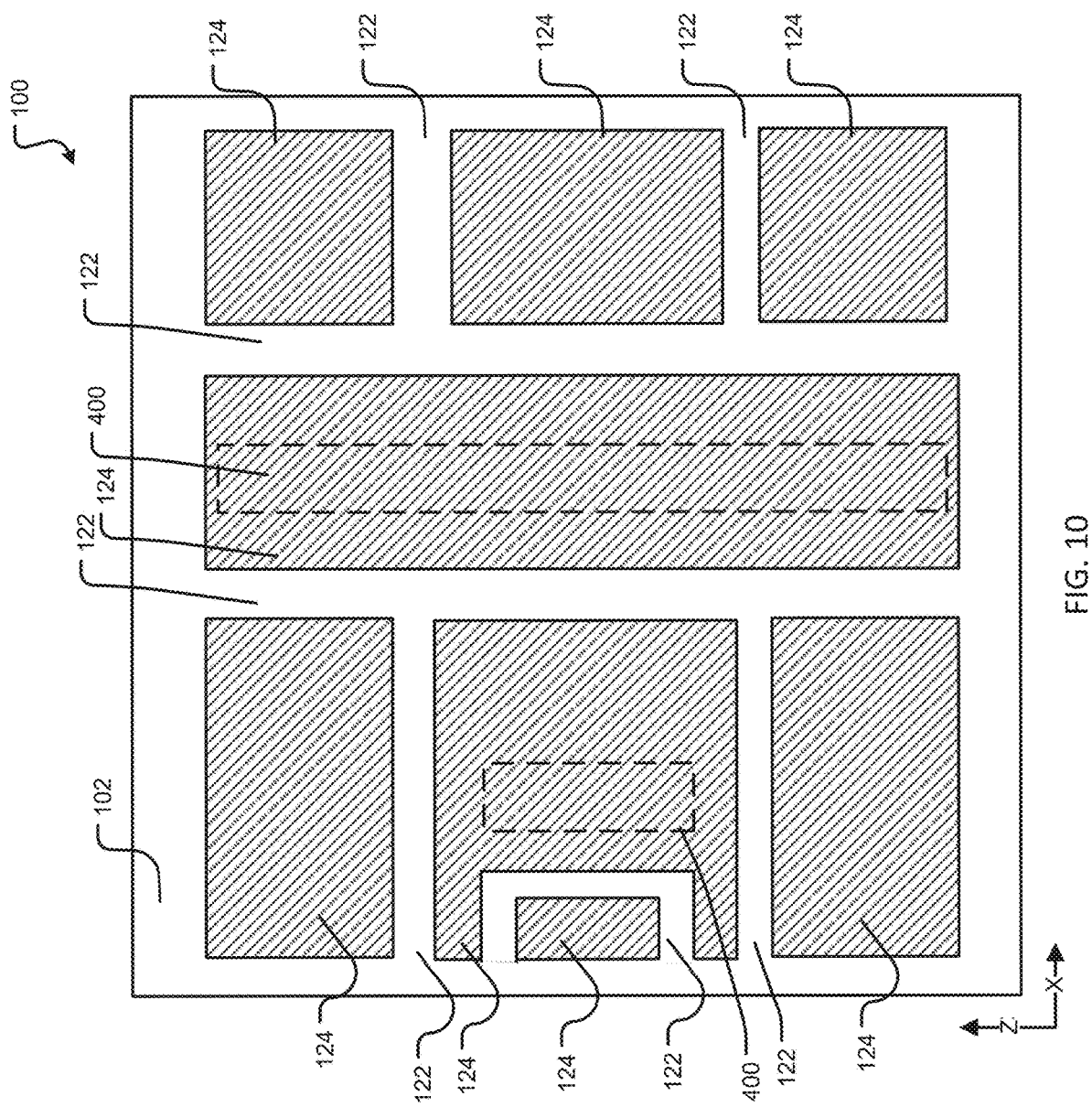
FIG. 10 illustrates an exemplary layout of die attach material according to the disclosure.

FIG. 10 illustrates an exemplary layout of die attach material according to the disclosure.

In particular, FIG. 10 illustrates alternative implementations of the one or more channels 122 forming numerous portions of the die attach material 124. Each of the various aspects, configurations, components, processes, and the like as described herein may be implemented in conjunction with the FIG. 10 layout. As illustrated in FIG. 10, various implementations of the one or more channels 122 may connect to form the various portions of the die attach material 124 as illustrated in FIG. 10. Additionally, FIG. 10 illustrates formation of the one or more channels 122 defining the die attach material 124 where there is no implementation of the one or more active areas 400. For example, formation of the one or more channels 122 defining the die attach material 124 where there is no implementation of the one or more active areas 400 in adjacent portions of the die attach material 124. Additionally, there may be some benefits to larger portions of the die attach material 124. In this regard, during manufacturing, a thickness of the die attach material 124 may vary within a particular area and the larger area of the die attach material 124 may allow for a certain degree of self-leveling during the curing process in order to provide a more uniform thickness and/or more uniform connection. In one aspect, the one or more channels 122 includes multiple channels. In one aspect, the one or more channels 122 includes at least two channels that intersect. In one aspect, the one or more channels 122 includes more than two channels intersect. In one aspect, the one or more channels 122 may form a mesh of channels.

Each of the various configurations of the one or more channels 122 and the die attach material 124 illustrated in FIG. 5-FIG. 10 may be combined or selectively utilized in the package 100 as described herein. More specifically, the package 100 may utilize any number or any configuration of the one or more channels 122 as illustrated and described herein; and the package 100 may utilize any number or any configuration of the die attach material 124 as illustrated and described herein.

Figure 11:
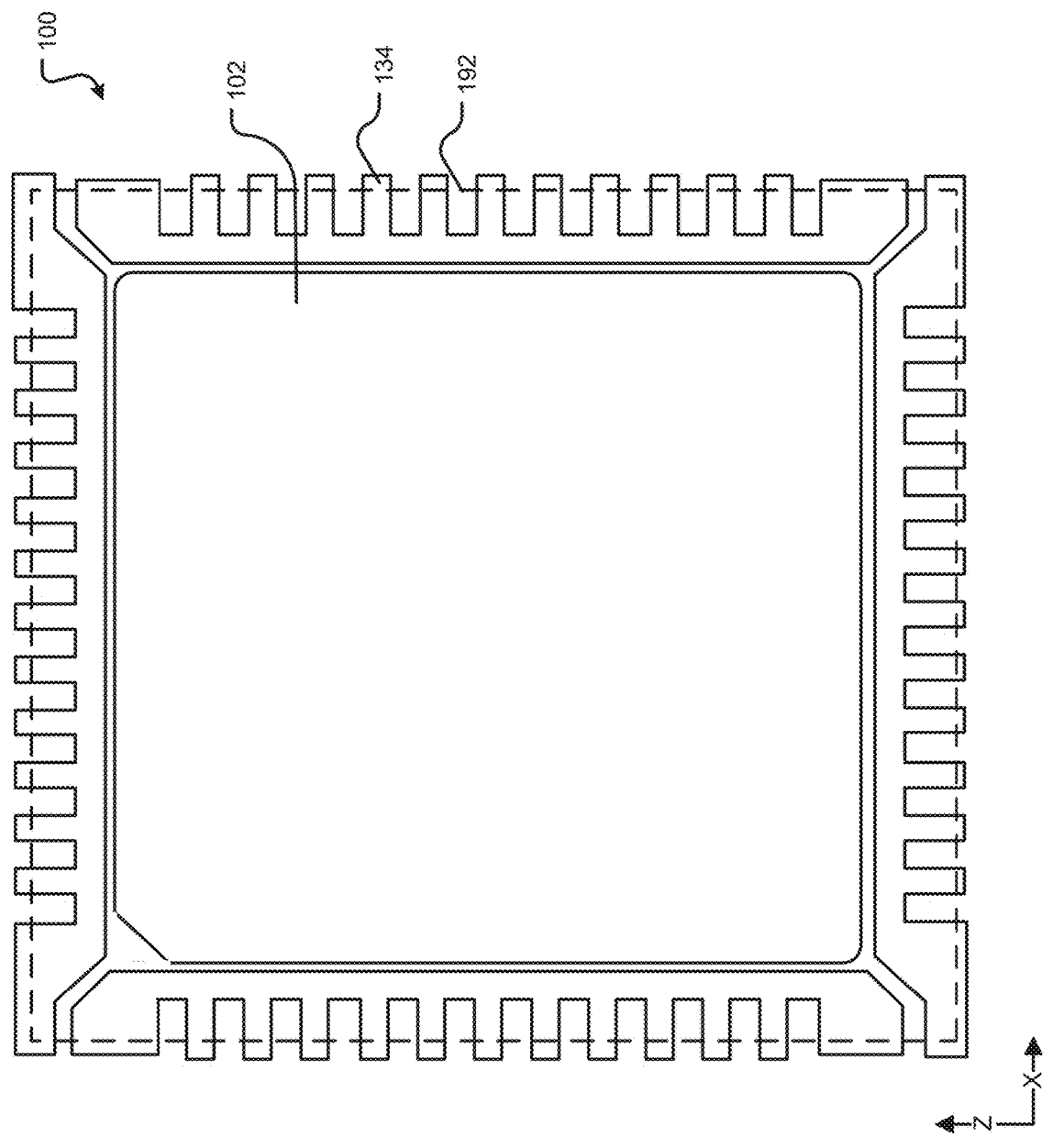
FIG. 11 illustrates a partial top view of the package according to FIG. 1.

FIG. 11 illustrates a partial top view of the package according to FIG. 1.

In particular, FIG. 11 shows an exemplary implementation of a package 100 that may include any one or more features, components, arrangements, and the like as described herein. More specifically, FIG. 11 illustrates the package 100 without illustration of a number of components of the package 100 for ease of understanding. With reference to FIG. 11, the package 100 may include a support 102. In one aspect, the support 102 may be implemented as a paddle.

The support 102 implemented as a paddle may include a metal material such as copper and/or the like. Moreover, the support 102 implemented as a paddle may include a metal plating material. The metal plating material may include any metallic material such as silver. In one aspect, the support 102 is implemented as a paddle and includes copper with a metal plating material that includes silver. The support 102 may be connected to and/or supported by a lead frame 192. The lead frame 192 may include or connect to the one or more input/output pins 134.

The support 102 may also be implemented as a surface, a package support, a package surface, a package support surface, a metal submount, a flange, a metal flange, a heat sink, a common source support, a common source surface, a common source package support, a common source package surface, a common source package support surface, a common source flange, a common source heat sink, a leadframe, a metal leadframe, and the like, and/or combinations thereof. The support 102 may include a metal material, an insulating material, a dielectric material, and the like, and/or combinations thereof.

Figure 12:
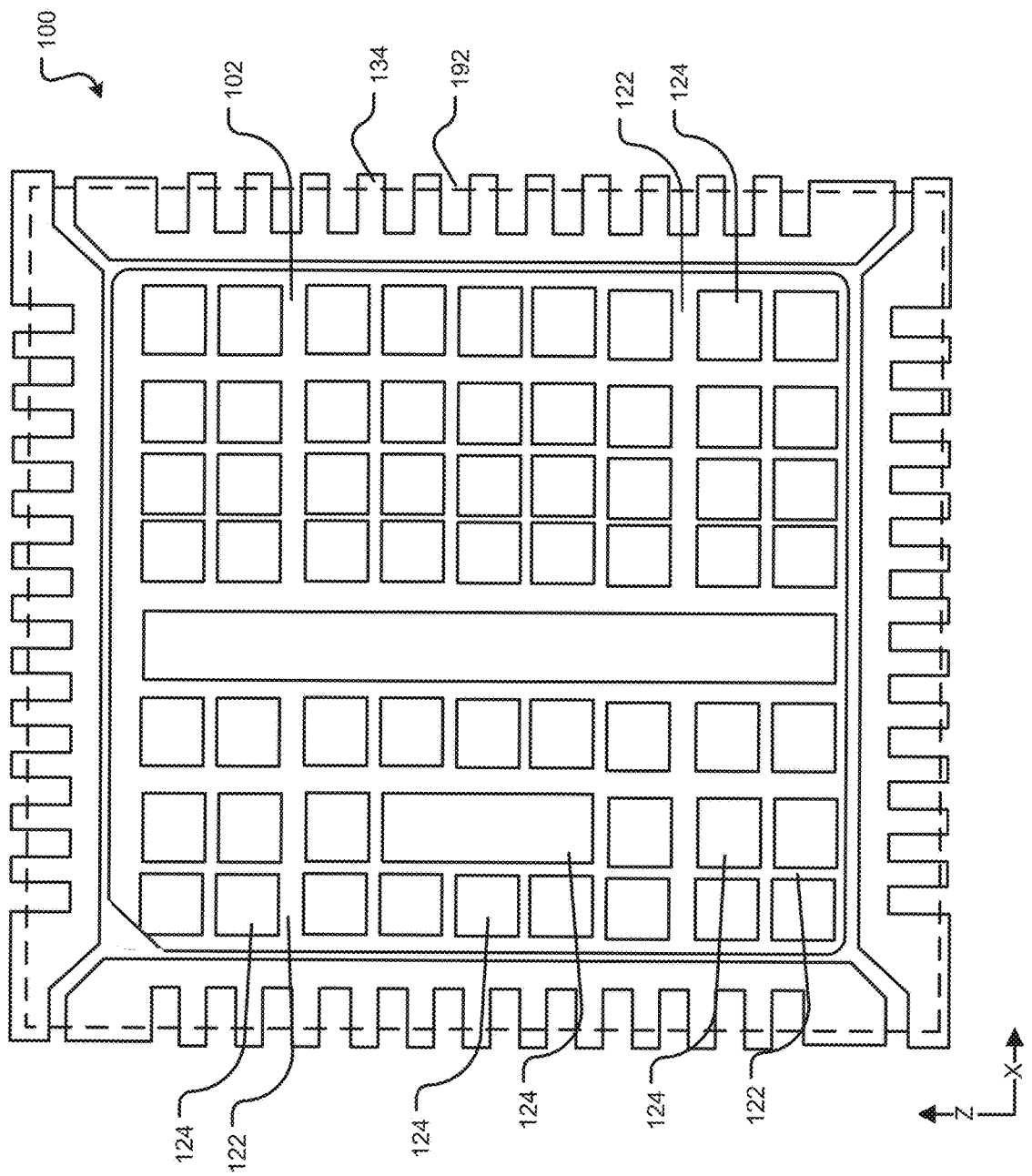
FIG. 12 illustrates a partial top view of the package according to FIG. 11.

FIG. 12 illustrates a partial top view of the package according to FIG. 11.

In particular, FIG. 12 illustrates the package 100 without illustration of a number of components of the package 100 for ease of understanding. With further reference to FIG. 12, the package 100 is illustrated with an exemplary arrangement of a die attach material 124 arranged on the support 102. The die attach material 124 may be located in a number of specific locations across the support 102 as further described herein. An arrangement of the die attach material 124 may form and/or include one or more channels 122. In one aspect, the die attach material 124 may form a mesh of one or more channels 122. Note that the construction illustrated in the Figures includes numerous portions of the die attach material 124 and the one or more channels 122, each of which may not include reference numerals for ease of illustration.

In one aspect, the die attach material 124 may form a mesh of one or more channels 122 and may be arranged in squares and/or rectangles. However, the die attach material 124 may be configured with any shape. The size, arrangement, location, number, and/or the like of the die attach material 124 illustrated in FIG. 12 and elsewhere in this disclosure is merely exemplary. Other configurations of the die attach material 124 are contemplated as well. In one aspect, the one or more channels 122 includes multiple channels. In one aspect, the one or more channels 122 includes at least two channels that intersect. In one aspect, the one or more channels 122 includes more than two channels intersect. In one aspect, the one or more channels 122 may form a mesh of channels.

Figure 13:
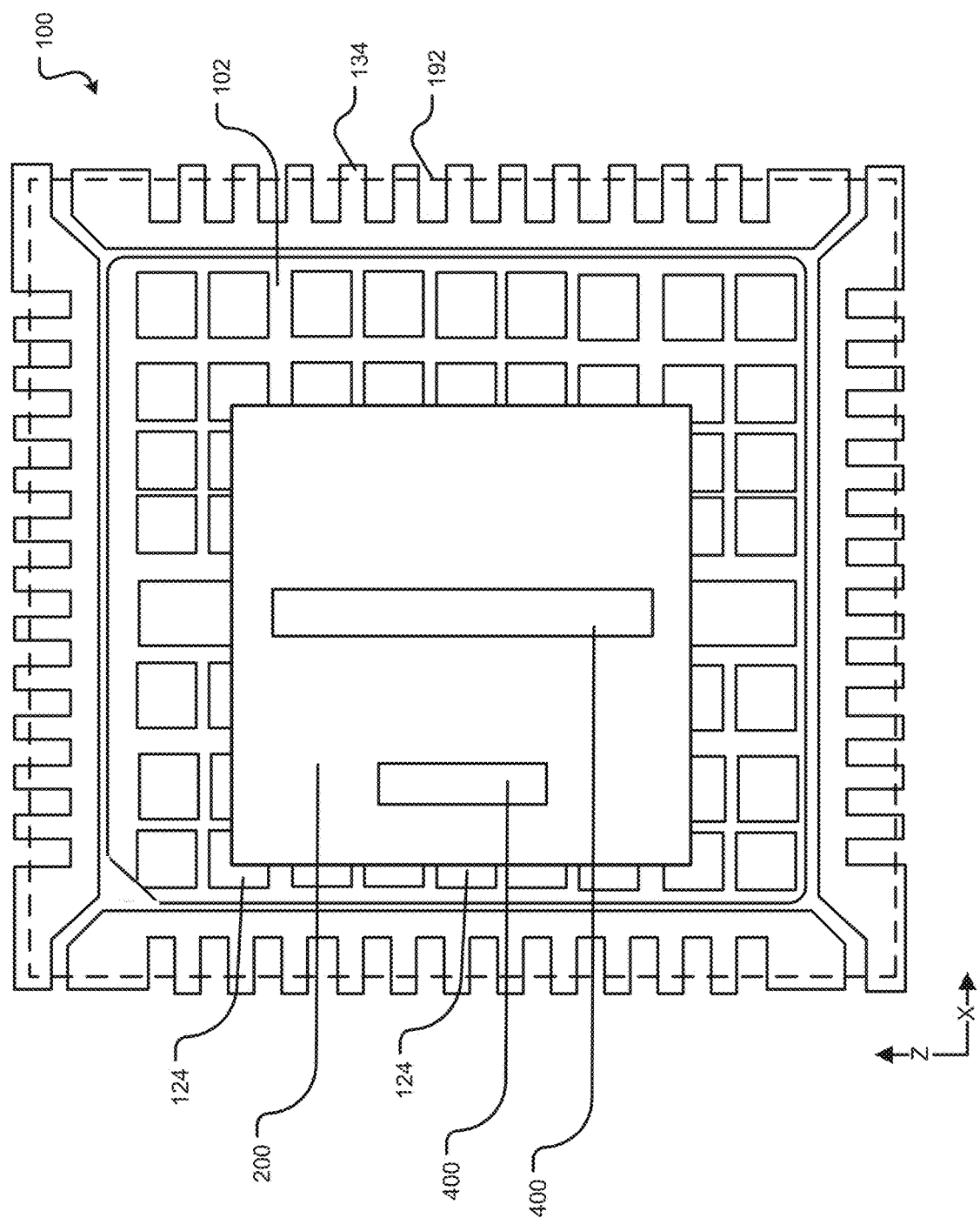
FIG. 13 illustrates a partial top view of the package according to FIG. 11.

FIG. 13 illustrates a partial top view of the package according to FIG. 11.

In particular, FIG. 13 illustrates the package 100 without illustration of a number of components of the package 100 for ease of understanding. With reference to FIG. 13, the package 100 may include a semiconductor die 200 having one or more active areas 400. In this regard, the package 100 illustrated in FIG. 13 shows two of the one or more active areas 400. However, the package 100 may include any number of the one or more active areas 400. Additionally, the semiconductor die 200 may be attached to the package 100 and the support 102 by the die attach material 124.

Figure 14:
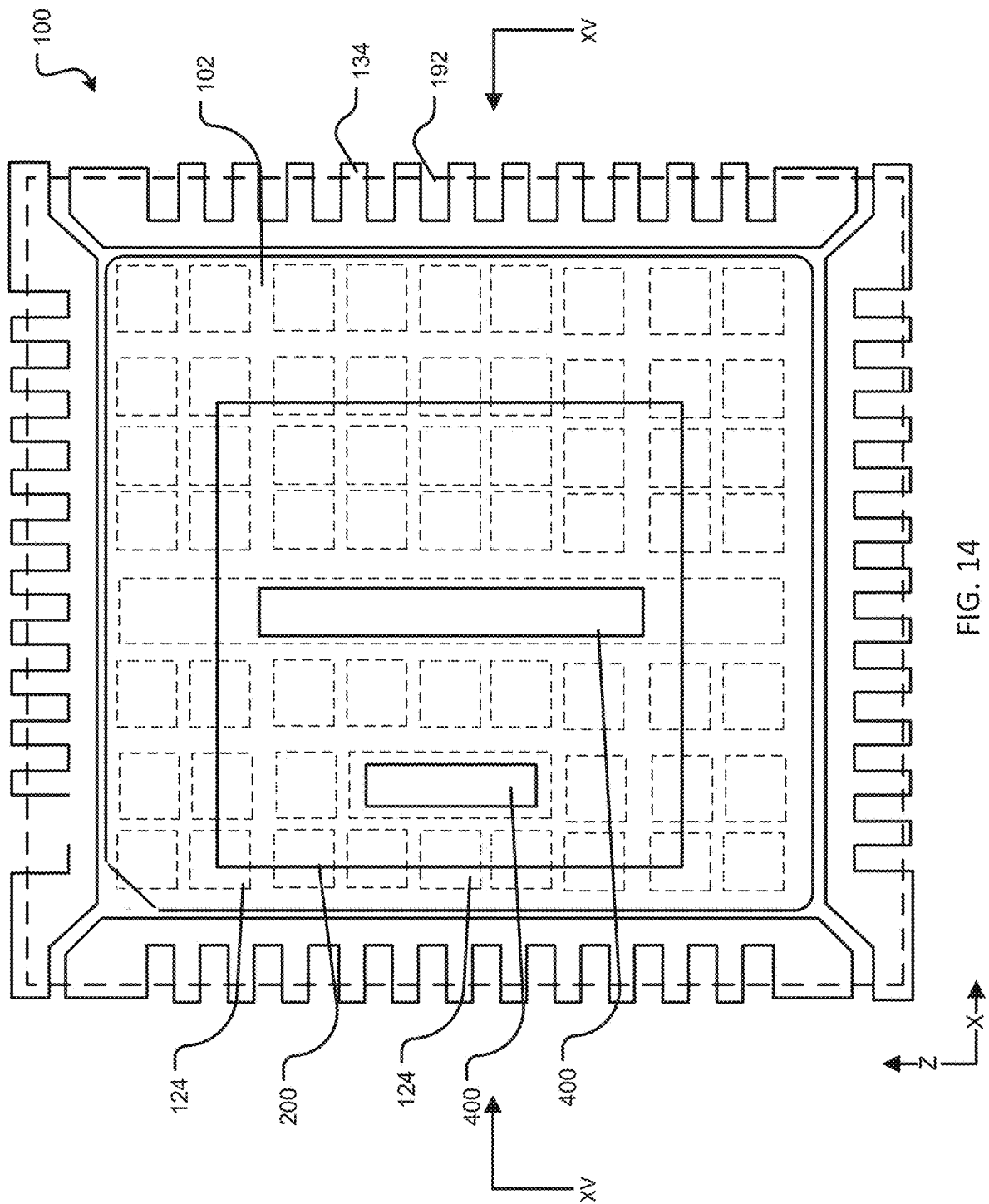
FIG. 14 illustrates a partial top view of the package according to FIG. 13.

FIG. 14 illustrates a partial top view of the package according to FIG. 13.

In particular, FIG. 14 illustrates a transparent view of the semiconductor die 200 of the package 100 in order to appreciate the arrangement of the one or more active areas 400 with respect to the die attach material 124. This arrangement is further discussed in greater detail herein.

Figure 15A:
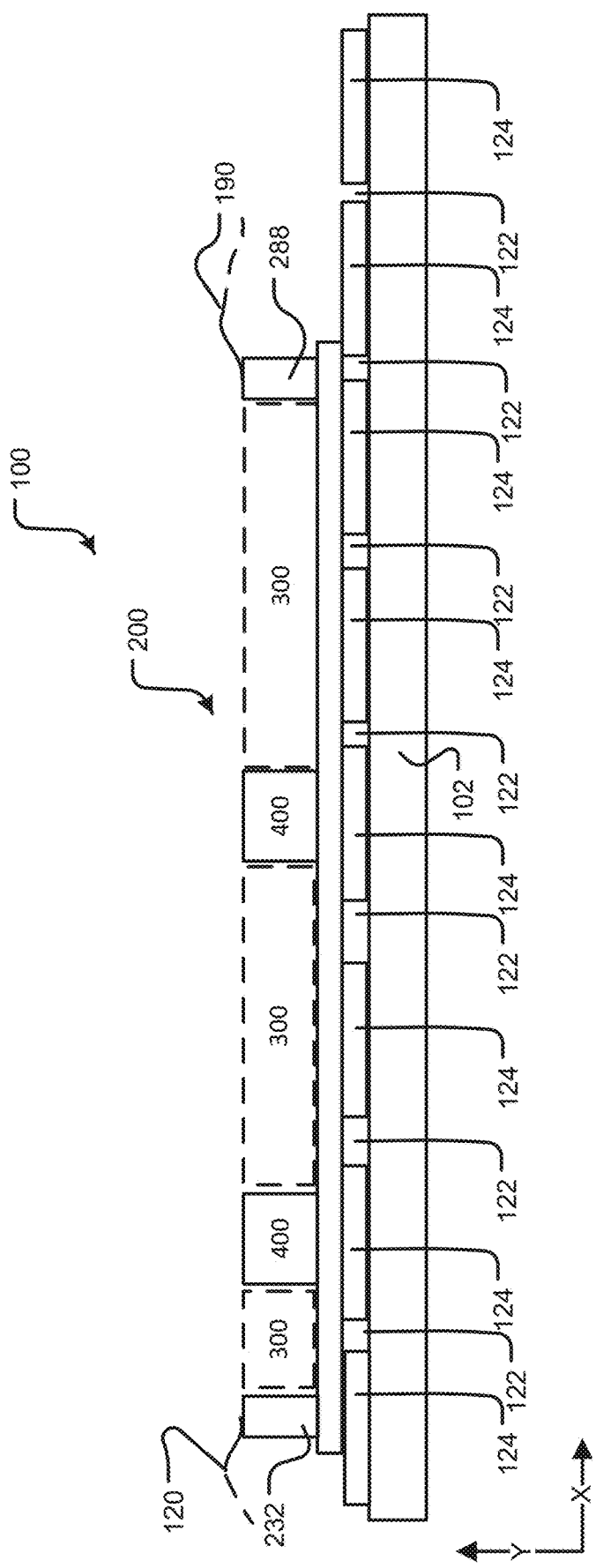
FIG. 15A illustrates a partial cross-sectional view of the package taken along lines XV-XV of FIG. 14.

FIG. 15A illustrates a partial cross-sectional view of the package taken along lines XV-XV of FIG. 14.

With reference to FIG. 15A, the semiconductor die 200 may be mounted on the support 102 using the die attach material 124. An arrangement of the die attach material 124 may form a mesh of one or more channels 122 and/or include one or more channels 122. As further described herein, the arrangement and the location of the die attach material 124 with the one or more channels 122 may be specific to the one or more active areas 400. In particular, the one or more channels 122 may be located vertically below along the y-axis with respect to the one or more active areas 400, but not directly below the one or more active areas 400. In other words, the one or more channels 122 may be located vertically below along the y-axis with respect to the one or more active areas 400 and offset from the active area 400 along the x-axis as further described herein.

The one or more channels 122 may be arranged under the at least one secondary device area 300. In particular aspects, the one or more channels 122 may be arranged directly under the at least one secondary device area 300 along the y-axis. For example, one or more channels 122 may be arranged under or directly under the at least one secondary device area 300, a flux pad, and/or the like along the y-axis and the x-axis.

Figure 15B:
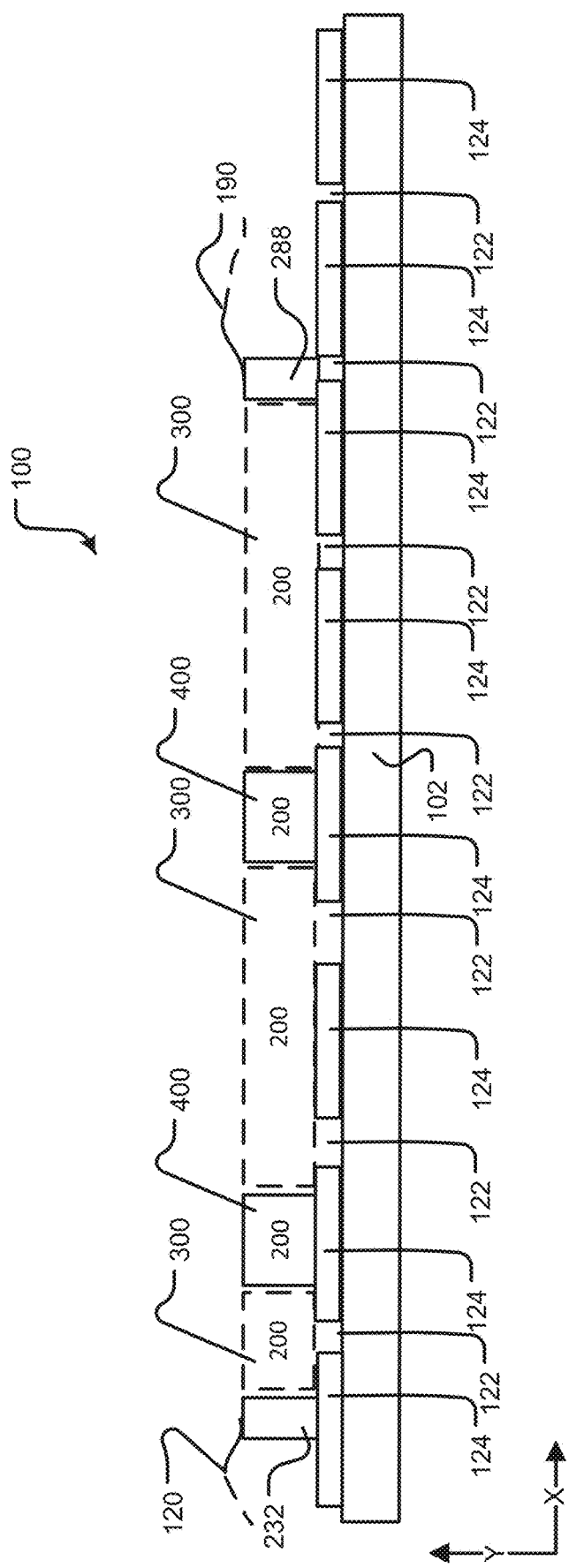
FIG. 15B illustrates a partial cross-sectional view of another aspect of FIG. 15A.

FIG. 15B illustrates a partial cross-sectional view of another aspect of FIG. 15A.

In particular, FIG. 15B illustrates an implementation of the package 100 implementing a plurality of the semiconductor die 200. Each of the various aspects, configurations, components, processes, and/or the like as described herein may be implemented in conjunction with the FIG. 15B implementation. With further reference to FIG. 15B, one or more of the semiconductor die 200 may be configured to be implemented as an implementation of the at least one secondary device area 300; and one or more of the semiconductor die 200 may be configured to be implemented as an implementation of the active area 400. In particular aspects, one or more of the plurality of the semiconductor die 200 may be implemented as discrete devices. In particular aspects, each of the plurality of the semiconductor die 200 may be implemented as discrete devices.

With reference to FIG. 15B, the plurality of the semiconductor die 200 may be mounted on the support 102 using the die attach material 124. The die attach material 124 may include the one or more channels 122. In particular, the one or more channels 122 may be located vertically below along the y-axis with respect to the semiconductor die 200 implemented as the one or more active areas 400, but not directly below the one or more active areas 400. In other words, the one or more channels 122 may be located vertically below along the y-axis with respect to the semiconductor die 200 implemented as the one or more active areas 400 and offset from the active area 400 along the x-axis as further described herein.

With further reference to FIG. 15B, the one or more channels 122 may be arranged under the semiconductor die 200 implemented as the at least one secondary device area 300. In particular aspects, the one or more channels 122 may be arranged directly under the semiconductor die 200 implemented as the at least one secondary device area 300 along the y-axis. For example, one or more channels 122 may be arranged under or directly under the semiconductor die 200 implemented as the at least one secondary device area 300, a flux pad, and/or the like along the y-axis and the x-axis.

Figure 16:
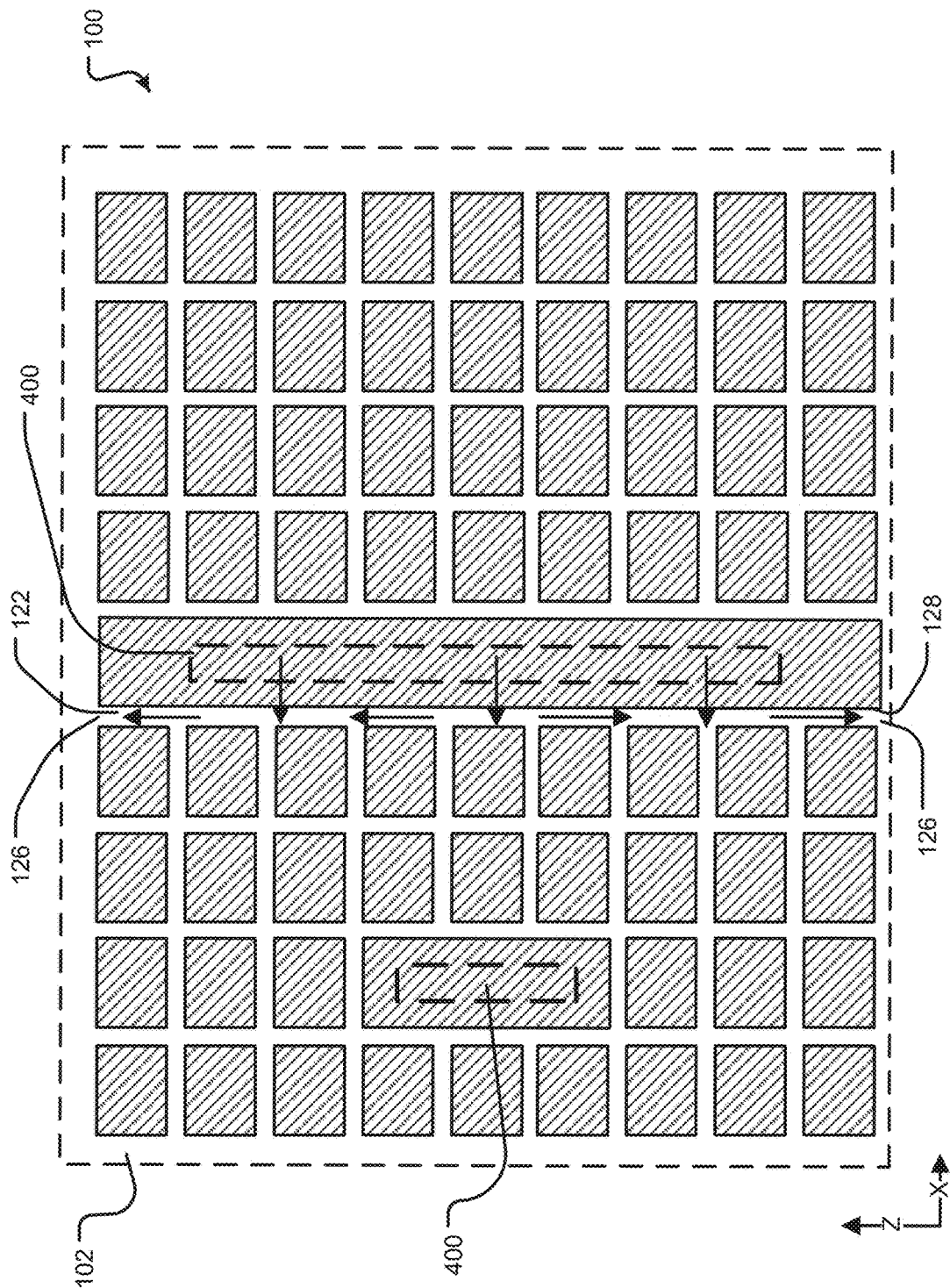
FIG. 16 illustrates a partial top view of the package according to FIG. 11.

FIG. 16 illustrates a partial top view of the package according to FIG. 11.

In particular, FIG. 16 illustrates an exemplary arrangement of the die attach material 124 arranged on the support 102. In particular, the die attach material 124 may include the one or more channels 122. The one or more channels 122 may be located vertically below along the y-axis of the one or more active areas 400 (shown by dashed lines in FIG. 16), but not directly below the one or more active areas 400. In other words, the one or more channels 122 may be located vertically below along the y-axis with respect to the one or more active areas 400 and offset with respect to the active area 400 along the x-axis.

The one or more channels 122 may be arranged under the at least one secondary device area 300. In particular aspects, the one or more channels 122 may be arranged directly under the at least one secondary device area 300 along the y-axis. For example, one or more channels 122 may be arranged under or directly under the at least one secondary device area 300, a flux pad, and/or the like along the y-axis and the x-axis.

The one or more channels 122 may include one or more exhaust vents 126 and the one or more side edges 128. The one or more channels 122 may be within a plane of the x-axis and z-axis parallel to the upper surface 180 of the support 102 and may be rectangular in shape, polygonal in shape, circular in shape, freeform in shape, continuous in shape, discontinuous in shape, and the like, and/or combinations thereof.

The one or more channels 122 may dissect the die attach material 124 within a plane of the x-axis and z-axis parallel to the upper surface 180 of the support 102. As illustrated in FIG. 16, there are numerous of the one or more channels 122 that dissect the die attach material 124 into numerous different sections. The package 100 may include any number of the one or more channels 122 and any number of sections of the die attach material 124.

The one or more side edges 128 of the one or more channels 122 may form a surface of the die attach material 124 that allows the gases generated during curing of the die attach material 124 to be released from the die attach material 124. In particular, the one or more channels 122 may form a surface utilizing the one or more side edges 128 of the die attach material 124 that allows the gases generated during curing to be released from the die attach material 124 from under the active area 400. More specifically, as shown by the arrows located partially in the die attach material 124 as illustrated in FIG. 16, gases generated during curing under the active area 400 may propagate toward the one or more side edges 128 of the one or more channels 122 and into the one or more channels 122. Accordingly, the one or more channels 122 in conjunction with the one or more side edges 128 help to reduce the formation of voids from under the active area 400 by providing a location to which gases generated during the curing process may escape from under the active area 400 and into the one or more channels 122.

Thereafter, the gases generated during curing under the active area 400 may enter the one or more channels 122. Once the gases are in the one or more channels 122, the gases may travel along the one or more channels 122 and exit from the one or more channels 122 through the exhaust vents 126 as shown by the arrows located within the one or more channels 122 as illustrated in FIG. 16.

In this regard, the one or more channels 122 allow gases generated during curing under the active area 400 to be released and reduce formation of voids from under the active area 400. Accordingly, the one or more channels 122 increases the cooling capability of the support 102 below the active area 400 by increasing the ability of heat generated by the active area 400 to be transferred from the semiconductor die 200 to the support 102. Additionally, implementation of the one or more channels 122 within the die attach material 124 may be even more beneficial to address various temperature extremes that may be more likely in high power applications of the package 100. In this regard, it is highly beneficial to maintain the active area 400 within 5° C. of a desired operating temperature range to ensure higher performance, high reliability, and/or the like.

With further reference to FIG. 16, the one or more channels 122 may have generally straight and/or linear constructions. The generally straight and/or linear constructions may include a first one of the exhaust vents 126 at one end and a second one of the exhaust vents 126 at the other end. However, the generally straight and/or linear constructions may include only one of the exhaust vents 126 at one end.

The one or more channels 122 may have multiple connected segments of generally straight and/or linear constructions. Each of the segments may be connected at any angle. The angle may include 1°-359°, 1°-40°, 40°-80°, 80°-120°, 120°-160°, 160°-200°, 200°-240°, 240°-280°, 280°-320°, or 320°-359°. As illustrated in FIG. 16, the multiple connected segments of generally straight and/or linear constructions are connected generally at 90° angles. Additionally, the multiple connected segments of generally straight and/or linear constructions may include a first one of the exhaust vents 126 at one end and a second one of the exhaust vents 126 at the other end. However, the multiple connected segments of generally straight and/or linear constructions may include only one of the exhaust vents 126 at one end.

The one or more channels 122 may increase robustness of the die attach material 124, increase a lifetime of the die attach material 124, and/or other beneficial improvements. In this regard, larger area die attach regions have been found to suffer from various failure mechanisms such as delamination, cracking, and/or the like. The various failure mechanisms may be a result of thermal expansion of the materials associated with the die attach material 124, the semiconductor die 200, the support 102, and/or the like. In this regard, the materials associated with the die attach material 124, the semiconductor die 200, the support 102, and/or the like may be different materials and may have different coefficients of thermal expansion. Accordingly, the different materials that may have different coefficients of thermal expansion may result in differing expansion when the semiconductor die 200 is operated at various temperature extremes. This results in an increased likelihood of the package 100, the semiconductor die 200, the die attach material 124, and/or the like experiencing one of the failure mechanisms.

The one or more channels 122 may reduce the larger area die attach region. In particular, the one or more channels 122 may break up the larger area die attach region into one or more smaller area die attach regions. In particular, as illustrated in FIG. 16, there are numerous of the one or more channels 122 that dissect the die attach material 124 into numerous different smaller sections. Accordingly, the different materials that may have different coefficients of thermal expansion that may result in differing expansion when the semiconductor die 200 is operated at various temperature extremes may have a reduced amount of expansion due to the smaller sections of the die attach material 124. This results in a decreased likelihood of the package 100 experiencing one of the failure mechanisms.

The die attach material 124 may be applied utilizing screen-printing processes, preform processes, needle dispensing systems, inkjet dispensing systems, masking processes, photoengraving processes, print onto transparent film processes, photo mask processes in combination with etching processes, photo-sensitized processes, laser resist ablation processes, milling processes, laser etching processes, direct metal printing processes, combinations thereof, and/or like processes as described herein.

Figure 17:
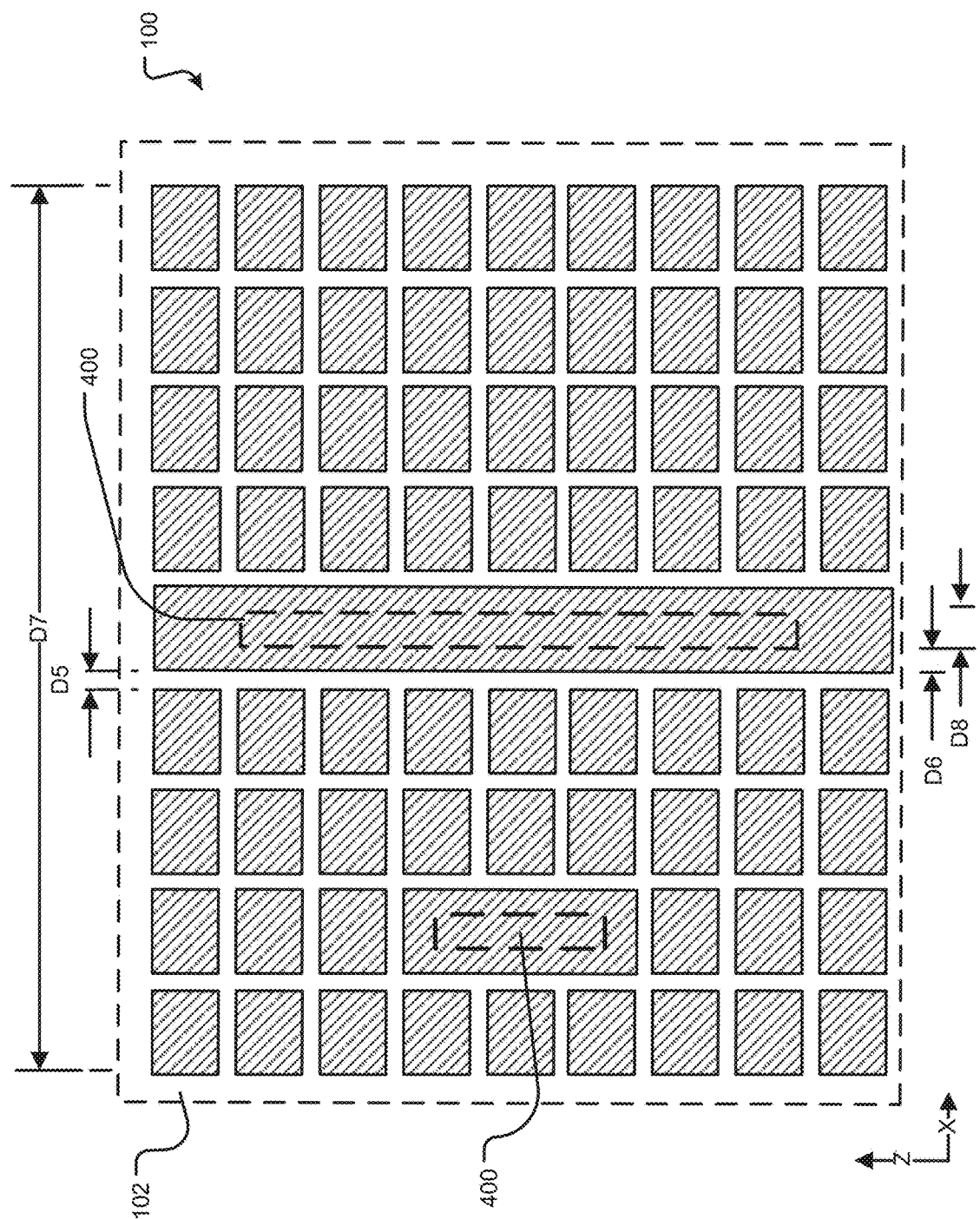
FIG. 17 illustrates various exemplary dimensions of channels of the die attach material according to the disclosure.

FIG. 17 illustrates various exemplary dimensions of channels of the die attach material according to the disclosure.

In particular, a location of the one or more channels 122 with respect to the active area 400 may be optimized for ensuring maximum heat transfer from the active area 400 to the support 102. Additionally, the location of the one or more channels 122 with respect to the active area 400 may be optimized for ensuring maximum reduction of voids and/or outgassing of the gas generated from the curing process from below the active area 400. More specifically, a width of the one or more channels 122 is illustrated and defined as being distance D5 along the x-axis; a distance from the active area 400 to the one or more channels 122 is defined as being a distance D6 along the x-axis; a length of the entire portion of the die attach material 124 is defined as a distance D7 along the x-axis; and a width of the active area 400 is defined as a distance D8 along the x-axis.

For example, the distance D5 may relate to the distance D6 as a relationship of a width of the one or more channels 122 to a distance from the one or more side edges 128 of the one or more channels 122 to an edge of the active area 400. The distance D5 may be 20%-300% of the distance D6, 20%-60% of the distance D6, 60%-100% of the distance D6, 100%-140% of the distance D6, 140%-180% of the distance D6, 180%-220% of the distance D6, 220%-260% of the distance D6, or 260%-300% of the distance D6.

For example, the distance D5 may relate to the distance D8 as a relationship of a width of the one or more channels 122 to a width of the active area 400. The distance D5 may be 20%-300% of the distance D8, 20%-60% of the distance D8, 60%-100% of the distance D8, 100%-140% of the distance D8, 140%-180% of the distance D8, 180%-220% of the distance D8, 220%-260% of the distance D8, or 260%-300% of the distance D8.

For example, the distance D5 may relate to the distance D7 as a relationship of a width of the one or more channels 122 to a width of the die attach material 124. The distance D5 may be 2%-40% of the distance D7, 2%-10% of the distance D7, 10%-20% of the distance D7, 20%-30% of the distance D7, or 30%-40% of the distance D7.

The various distances D5, D6, D7, and D8 may likewise be defined along the z-axis for configurations of the one or more channels 122, the active area 400, and/or the like formed along the z-axis.

Figure 18:
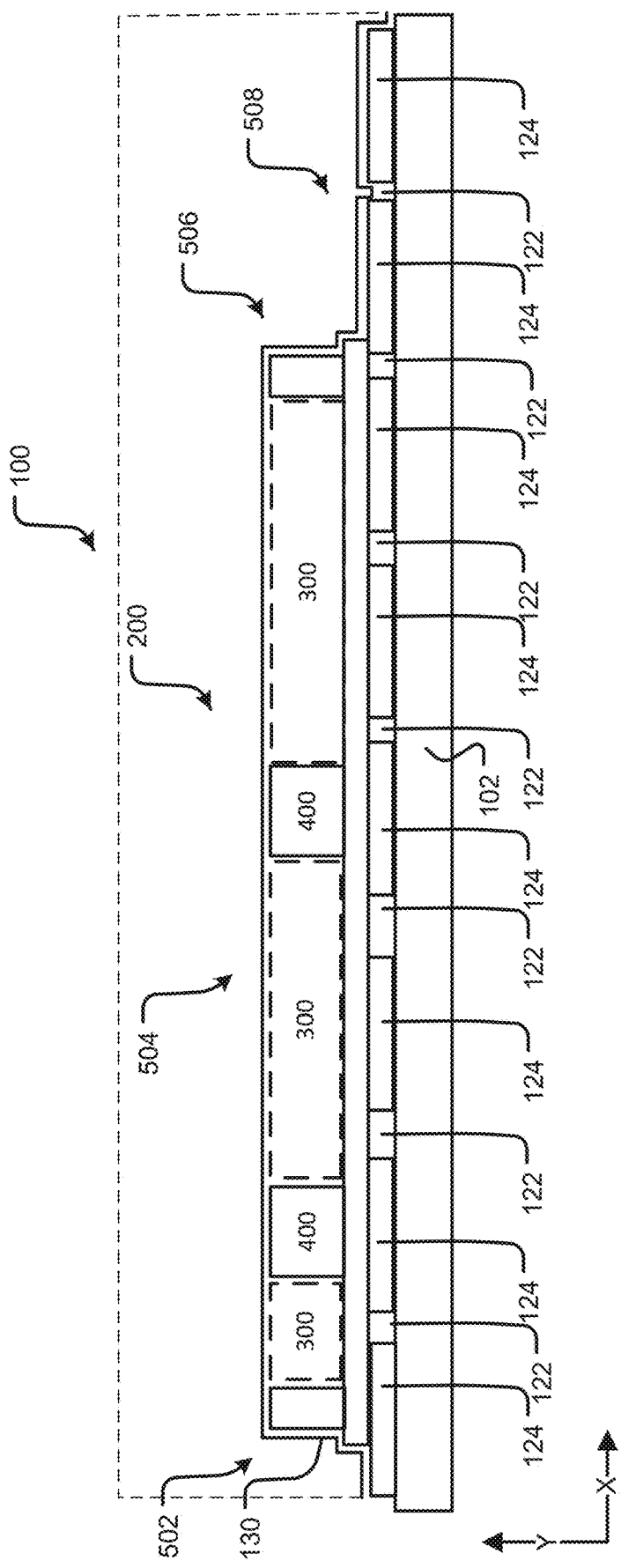
FIG. 18 illustrates a partial cross-sectional view of the package taken along lines XV-XV of FIG. 14.

FIG. 18 illustrates a partial cross-sectional view of the package taken along lines XV-XV of FIG. 14.

Figure 19:
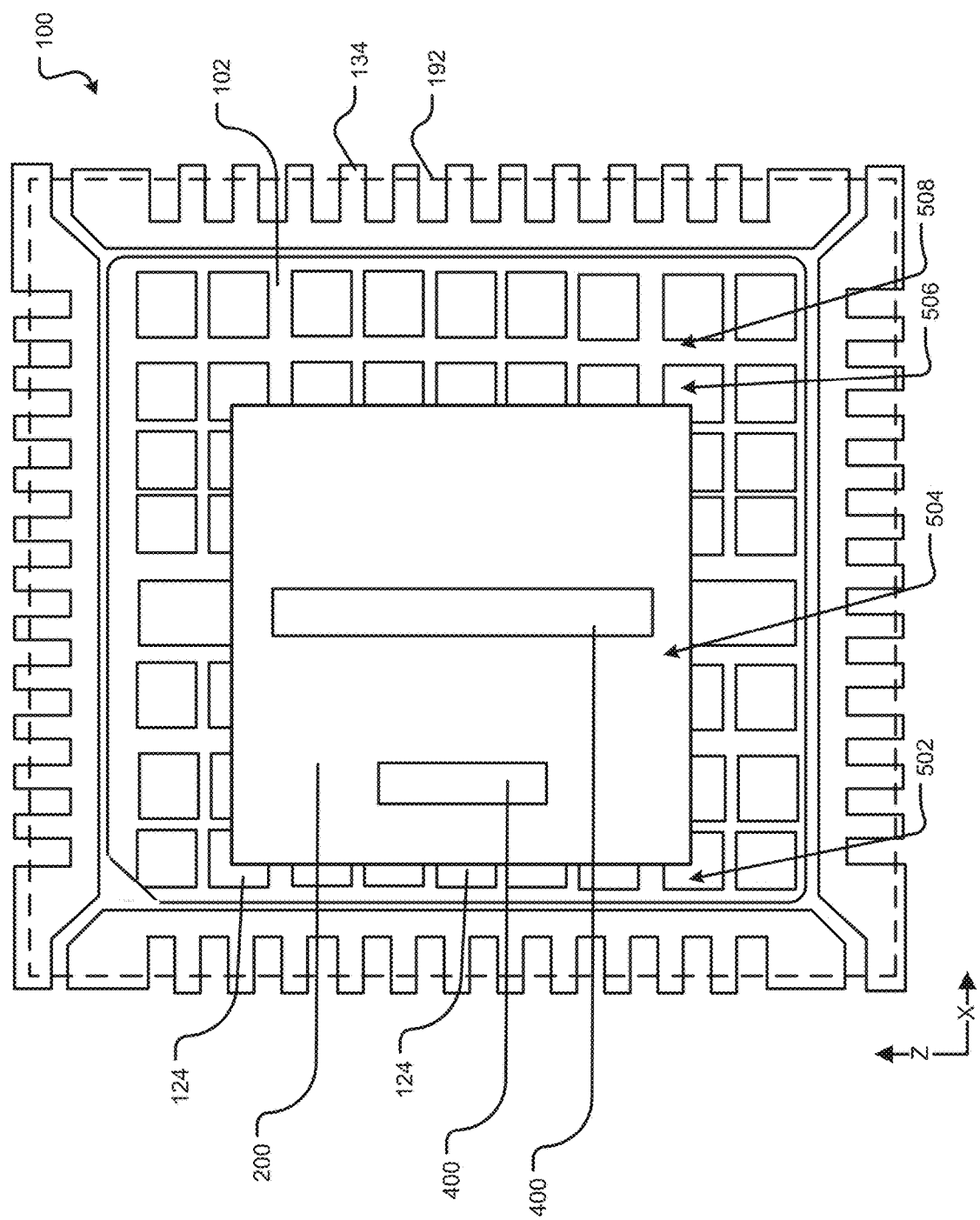
FIG. 19 illustrates a partial top view of the package according to FIG. 11.

FIG. 19 illustrates a partial top view of the package according to FIG. 11.

With reference to FIG. 1, the package 100 may include an overmold 130, and/or the like. The overmold 130 may be formed of a plastic material, a synthetic material, a plastic polymer compound, and the like, and/or combinations thereof, which may be injection molded around the support 102 and the semiconductor die 200, thereby providing protection from the outside environment. The overmold 130 may substantially surround the semiconductor die 200, the one or more active areas 400, and/or the other components of the package 100.

With reference to FIG. 18 and FIG. 19, there are portions of the die attach material 124 that may extend beyond the semiconductor die 200 covering the support 102. These portions of the die attach material 124 may improve overmold plastic adhesion of the overmold 130 of the package 100 to the support 102. Moreover, these portions of the die attach material 124 may avoid selective plating of the support 102. Additionally, this construction may allow one common package lead frame for all die sizes of the semiconductor die 200 used in a package type.

In one aspect that implements portions of the die attach material 124 that may extend beyond the semiconductor die 200, the overmold 130 may adhere in a section 502 to the die attach material 124 and the side edges of the semiconductor die 200. Additionally, the overmold 130 may adhere in a section 504 on a top surface of the semiconductor die 200. Additionally, the overmold 130 may adhere in a section 506 to side edges of the semiconductor die 200. Additionally, the overmold 130 in section 508 may adhere to an upper surface of one or more of the die attach material 124 and may extend into an adhere to a portion of the one or more channels 122. In this regard, the synthetic material may more reliably adhere to the one or more channels 122 and the die attach material 124, which reduces failures of the package 100. In particular, the overmold 130 arranged on the die attach material 124 and/or the one or more channels 122 may promote mold compound adhesion of the overmold 130 to the semiconductor die 200 within the package 100. Additionally, the package 100 may be subjected to a cleaning process, such as a plasma cleaning process, prior to installation and/or arrangement of the overmold 130 on the semiconductor die 200. In this regard, the cleaning process may physically modify the die attach material 124. In particular, the cleaning process may create pores or increase porosity of the die attach material 124. This physical modification may additionally promote mold compound adhesion of the overmold 130 to the semiconductor die 200 within the package 100.

Alternatively, the package 100 may be implemented to include an open cavity configuration suitable for use with the semiconductor die 200. In particular, the open cavity configuration may utilize an open cavity package design. In some aspects, the open cavity configuration may include a lid or other enclosure for protecting interconnects, circuit components, the semiconductor die 200, and/or the like. The package 100 may include a ceramic body, a lid, and one or more metal contacts.

Figure 20:
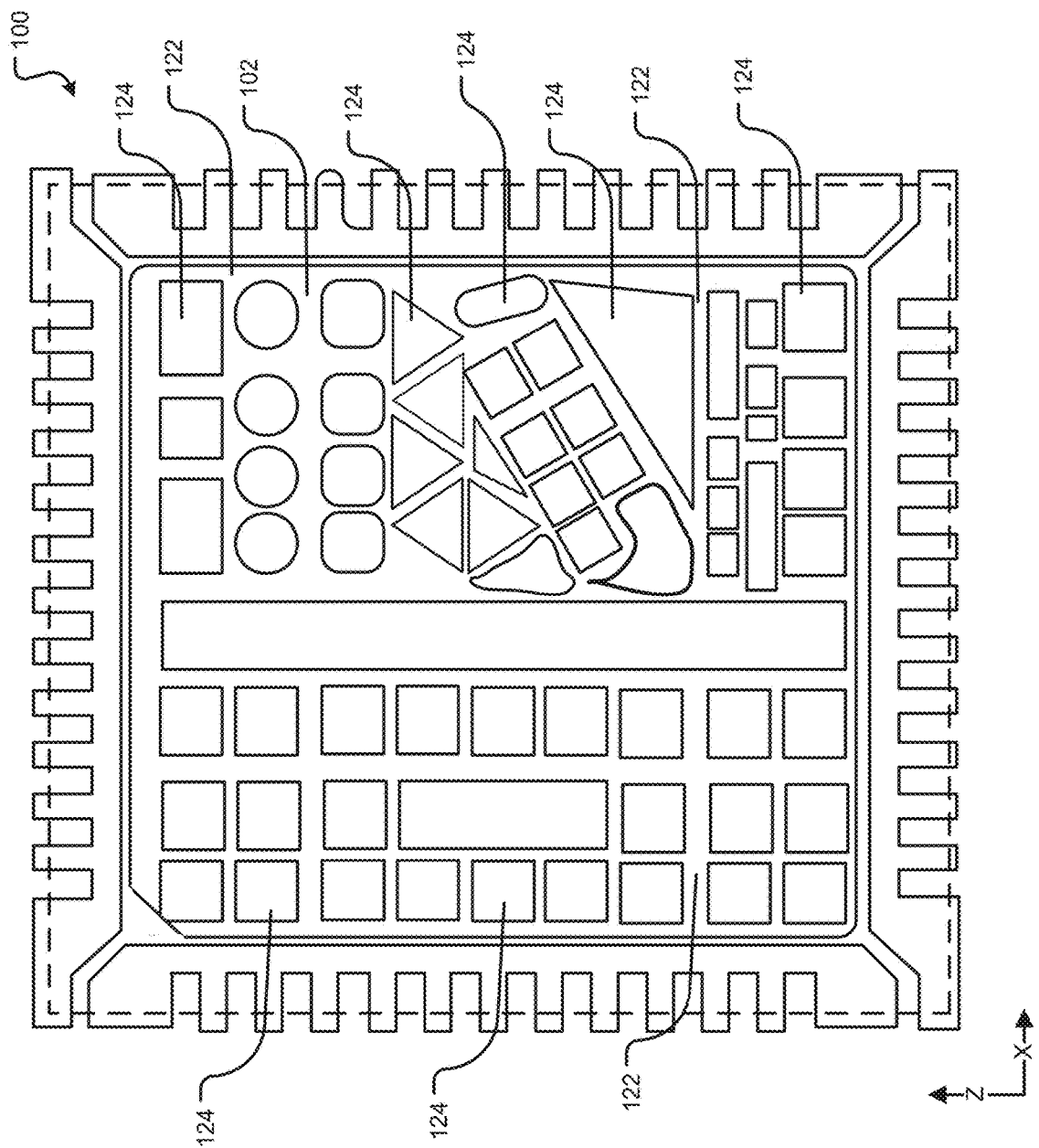
FIG. 20 illustrates a partial top view of the package according to FIG. 11.

FIG. 20 illustrates a partial top view of the package according to FIG. 11.

In particular, FIG. 20 illustrates alternative implementations of the die attach material 124 and the one or more channels 122 having various constructions. In particular, the die attach material 124 may have circular shapes, triangular shapes, freeform shapes, and/or the like. Additionally, the one or more channels 122 may have a varying sizes and shapes as illustrated in FIG. 20.

Figure 21:
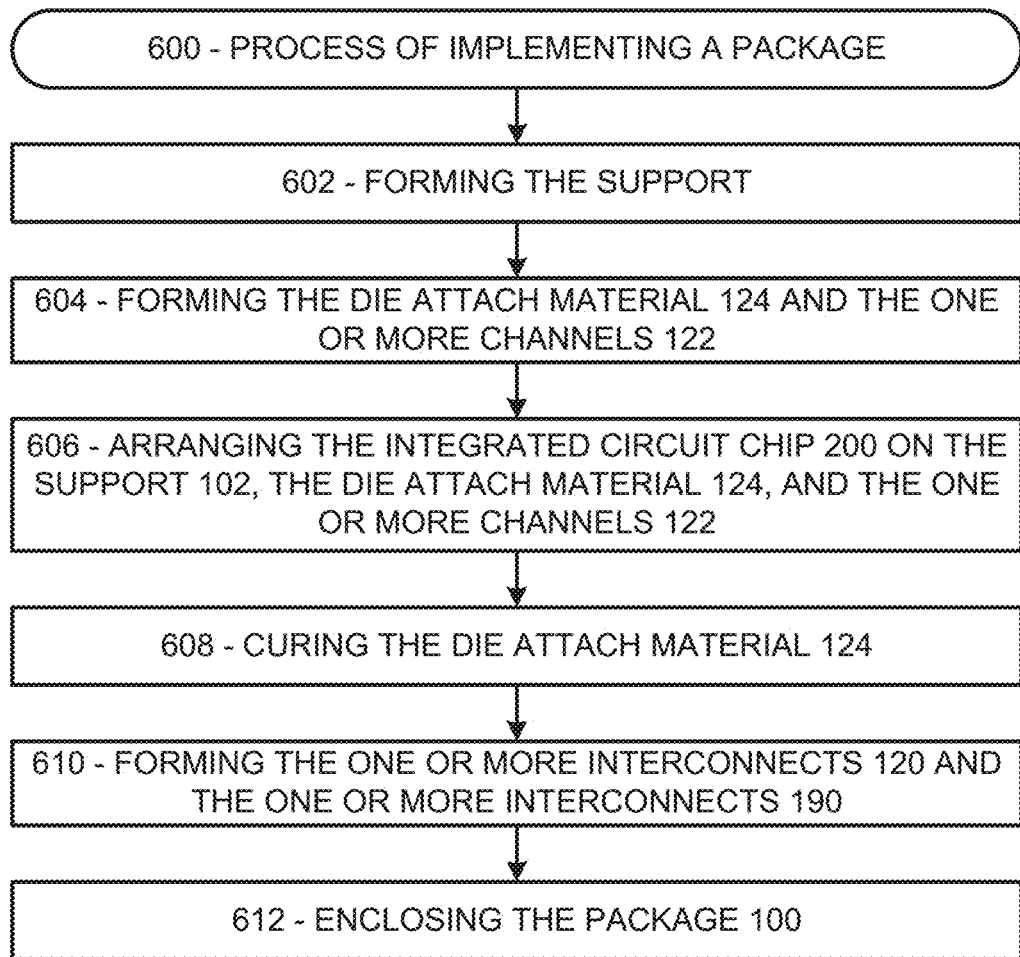
FIG. 21 illustrates a process of making a package according to the disclosure.

FIG. 21 illustrates a process of implementing a package according to the disclosure.

In particular, FIG. 21 illustrates a process of implementing a package (Box 600) that relates to implementing, making, manufacturing, forming, and/or the like the package 100 as described herein. It should be noted that the aspects of process of implementing a package (Box 600) may be performed in a different order consistent with the aspects described herein. Moreover, the process of implementing a package (Box 600) may be modified to have more or fewer processes consistent with the various aspects disclosed herein.

Initially, the process of implementing a package (Box 600) may include a process of forming the support 102 (Box 602). More specifically, the support 102 may be constructed, configured, and/or arranged as described herein.

In particular, the support 102 may be implemented as a paddle. The support 102 implemented as a paddle may include a metal material such as copper and/or the like. Moreover, the support 102 implemented as a paddle may include a metal plating material. The metal plating material may include any metallic material such as silver. In one aspect, the support 102 is implemented as a paddle and includes copper with a metal plating material that includes silver. The support 102 may be connected to and/or supported by a lead frame 192. The lead frame 192 may include or connect to the one or more input/output pins 134. Alternatively, the support 102 may be formed as a support, a surface, a package support, a package surface, a package support surface, a metal submount, a flange, a metal flange, a heat sink, a common source support, a common source surface, a common source package support, a common source package surface, a common source package support surface, a common source flange, a common source heat sink, a leadframe, a metal leadframe, and the like, and/or combinations thereof. The support 102 may be formed with a metal material, an insulating material, a dielectric material, and the like, and/or combinations thereof.

Further, the process of implementing a package (Box 600) may include forming the die attach material 124 and the one or more channels 122 (Box 604). More specifically, the die attach material 124 and the one or more channels 122 may be constructed, configured, and/or arranged as described herein on at least a portion of the support 102.

In particular, the die attach material 124 and the one or more channels 122 may be formed utilizing screen-printing processes, preform processes, needle dispensing systems, inkjet dispensing systems, masking processes, photoengraving processes, print onto transparent film processes, photo mask processes in combination with etching processes, photo-sensitized processes, laser resist ablation processes, milling processes, laser etching processes, direct metal printing processes, combinations thereof, and/or like processes as described herein.

Additionally, the process of implementing a package (Box 600) may include arranging the semiconductor die 200 on the support 102, the die attach material 124, and the one or more channels 122 (Box 606). More specifically, the semiconductor die 200 may be constructed, configured, and/or arranged as described herein. Thereafter, the semiconductor die 200 may be arranged on the support 102, the die attach material 124, and the one or more channels 122 as described herein.

More specifically, the arranging the semiconductor die 200 on the support 102, the die attach material 124, and the one or more channels 122 (Box 606) may include utilizing and/or implementing a pick and place assembly to place the semiconductor die 200 on the support 102.

Additionally, the process of implementing a package (Box 600) may include curing the die attach material 124 (Box 608) as described herein. In particular, the semiconductor die 200, the support 102, the die attach material 124, the one or more channels 122, and/or the like may be placed in an environment of elevated temperature, such as an oven. In this regard, the one or more side edges 128 of the one or more channels 122 may form a surface of the die attach material 124 that allows the gases generated during curing of the die attach material 124 to be released from the die attach material 124. In particular, the one or more channels 122 may form a surface utilizing the one or more side edges 128 of the die attach material 124 that allows the gases generated during curing to be released from the die attach material 124 from under the active area 400.

Additionally, the process of implementing a package (Box 600) may include forming the one or more interconnects 120 and the one or more interconnects 190 (Box 610). More specifically, the one or more interconnects 190 may be constructed, configured, and/or arranged as described herein. In one aspect, the process of forming the one or more interconnects may include forming the one or more interconnects 120 and the one or more interconnects 190 by forming one or more wires, leads, vias, edge platings, circuit traces, tracks, and/or the like. In one aspect, the forming the one or more interconnects 120 and the one or more interconnects 190 (Box 610) may include connecting forming the one or more interconnects 120 and the one or more interconnects 190 by an adhesive, soldering, sintering, eutectic bonding, ultrasonic welding, a clip component, and/or the like as described herein.

Additionally, the process of implementing a package (Box 600) may include enclosing the package 100 (Box 612). More specifically, the package 100 may be constructed, configured, and/or arranged as described herein. In one aspect, the process of enclosing the package 100 (Box 612) may include forming an open cavity configuration, an overmold configuration, or the like.

Figure 22:
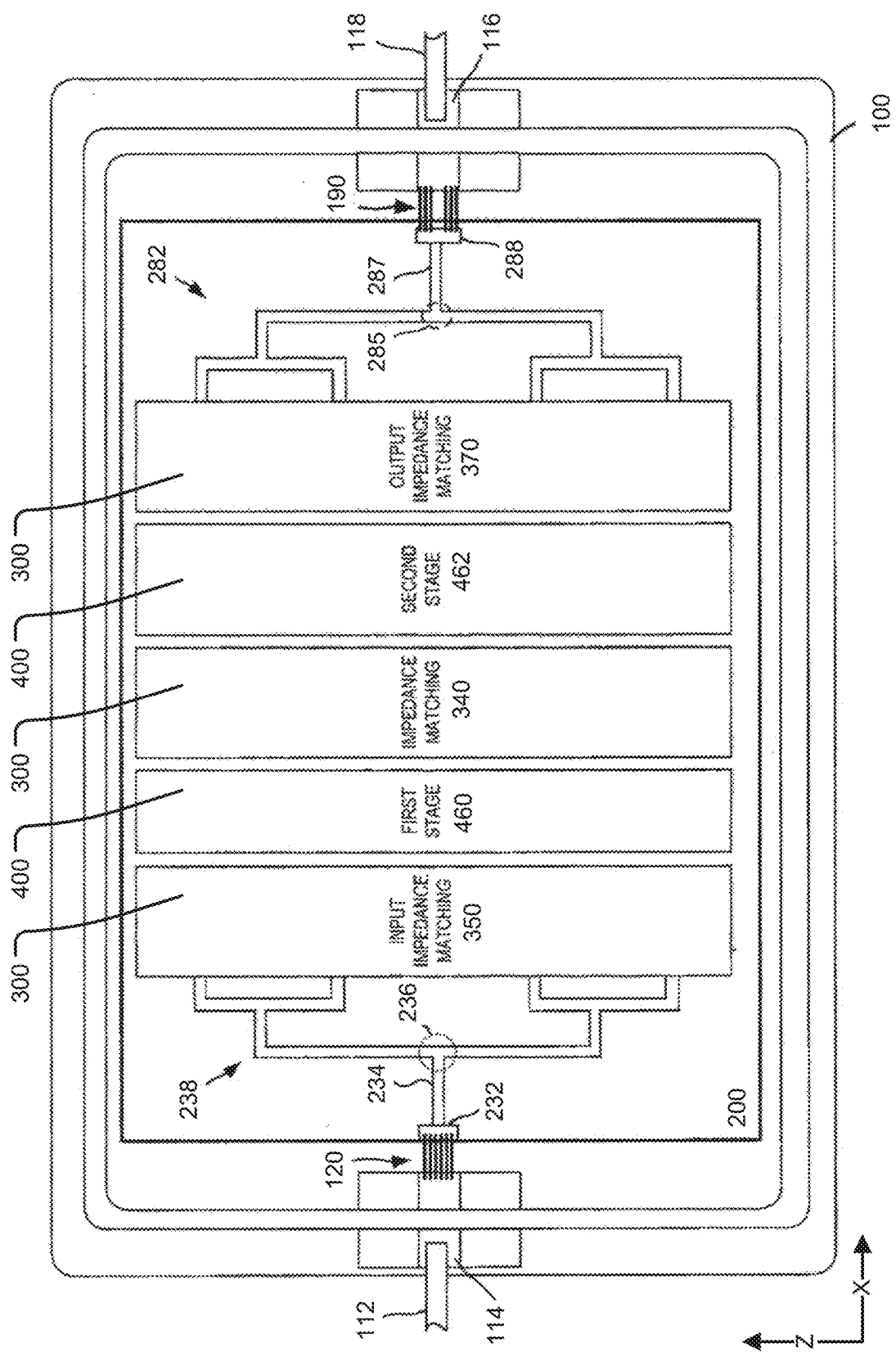
FIG. 22 illustrates a top view of an exemplary implementation of the package according to FIG. 1.

FIG. 22 illustrates a top view of an exemplary implementation of the package according to FIG. 1.

In particular, FIG. 22 illustrates a top view of an exemplary implementation of the package 100 implemented at least in part as a MMIC transistor amplifier. In this regard, the package 100 may be implemented utilizing numerous types of device technology, device topology, semiconductor types, transistor types, implementations of the semiconductor die 200, implementations of the at least one secondary device area 300, implementations of the one or more active areas 400, and the like as described herein. Accordingly, FIG. 22 is merely exemplary.

As shown in FIG. 22, the MMIC transistor amplifier includes the semiconductor die 200 that is contained within the package 100. The package 100 may include an input lead 112 and an output lead 118. The input lead 112 may be mounted to an input lead pad 114 by, for example, an adhesive, soldering, sintering, eutectic bonding, thermal compression bonding, ultrasonic bonding/welding, a clip component, and/or the like. One or more interconnects 120, such as input bond wires, may electrically connect the input lead pad 114 to an input bond pad 232 on the semiconductor die 200. A first end of one or more interconnects 120 may be directly connected to the input lead pad 114 and a second end of each of the one or more interconnects 120 may be connected to the input bond pad 232.

The semiconductor die 200 may further include a feed network 238 that may include an input splitting node 236 that may be connected to the input bond pad 232 by a transmission line 234, a first one of the at least one secondary device area 300 may be implemented as an input impedance matching network 350, a first one of the one or more active areas 400 may be implemented as a first transistor stage 460, a second one of the at least one secondary device area 300 may be implemented as an intermediate impedance matching network 340, a second one of the one or more active areas 400 may be implemented as a second transistor stage 462, and a third one of the at least one secondary device area 300 may be implemented as an output impedance matching network 370.

The semiconductor die 200 may further include an output bond pad 288 and an output combining node 285. The output lead 118 may be connected to an output lead pad 116 by, for example, an adhesive, soldering, sintering, eutectic bonding, thermal compression bonding, ultrasonic bonding/welding, a clip component, and/or the like. One or more interconnects 190, such as output bond wires, may electrically connect the output lead pad 116 to the output bond pad 288. A first end of each the one or more interconnects 190 may be directly connected to the output lead pad 116 and a second end of the one or more interconnects 190 may be connected to the output bond pad 288. A transmission line 287 may connect the output bond pad 288 to a corporate feed network 282.

The input impedance matching network 350 may include reactive components such as capacitors, inductive elements, and/or the like as described herein that may improve the impedance match between the input lead 112 and the first transistor stage 460. Likewise, the output impedance matching network 370 may include reactive components such as capacitors, inductive elements, and/or the like as described herein that may be used to match the impedance of the outputs of the second transistor stage 462 to the output lead 118 of the package 100.

The intermediate impedance matching network 340 may include reactive components such as capacitors, inductive elements, and/or the like as described herein that may serve to better match the impedance at the output of the first transistor stage 460 to the impedance at the input of the second transistor stage 462, and may be similar to the input impedance matching network 350.

The first transistor stage 460 and the second transistor stage 462 may include a plurality of unit cell transistors that are electrically arranged in parallel. The first transistor stage 460 and the second transistor stage 462 may be provided in the MMIC amplifier to provide increased gain. It will be appreciated that in other cases only a single transistor stage may be provided, or more than two transistor stages may be provided, and the number of impedance matching stages may be adjusted accordingly.

As is further shown in FIG. 22, the input splitting node 236 and the output combining node 285 may both on the semiconductor die 200. As such, the one or more interconnects 120 and the one or more interconnects 190 may both be external to a loop defined by the parallel amplification paths included in the MMIC amplifier that extend between the input splitting node 236 and the output combining node 285.

Figure 23:
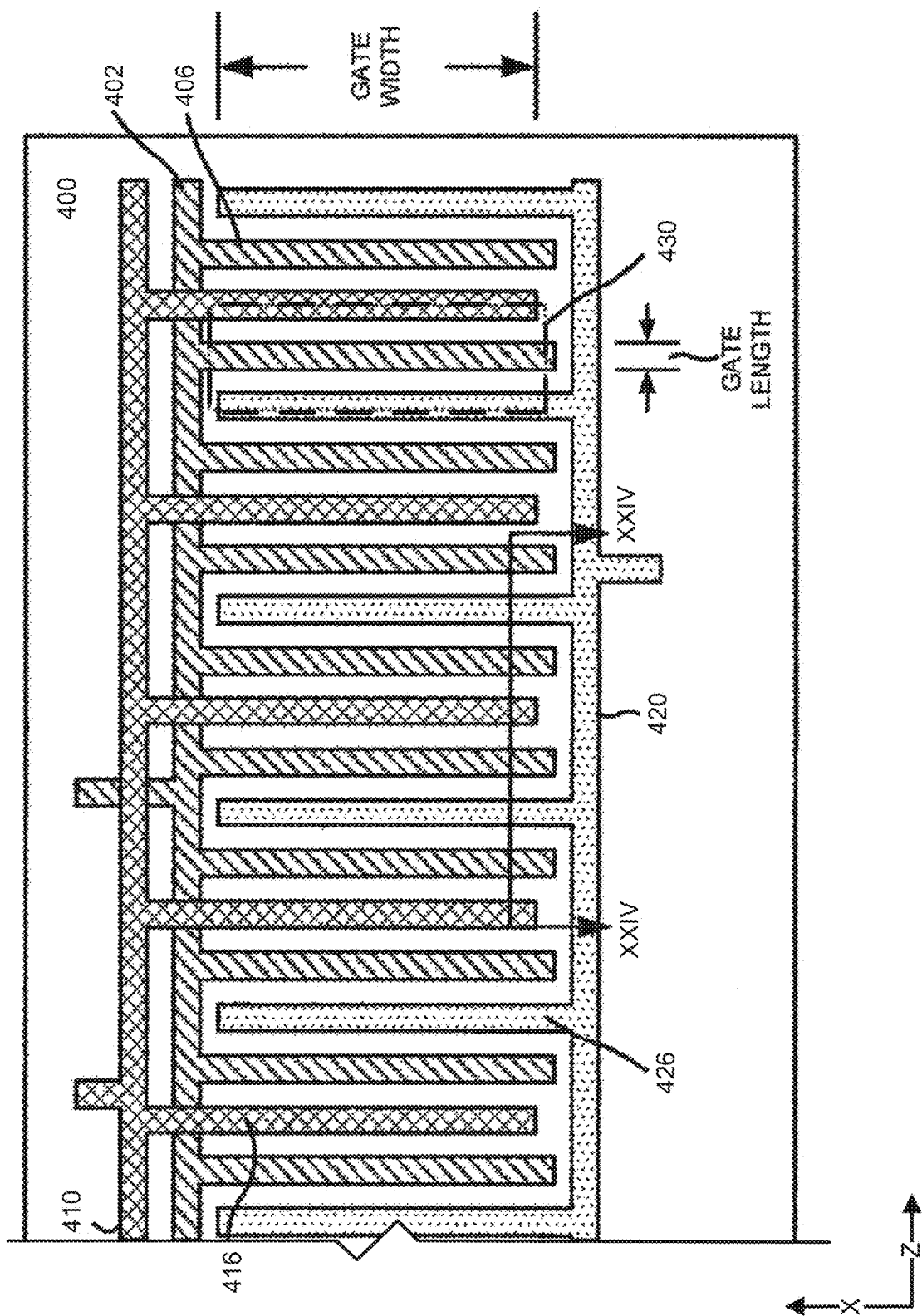
FIG. 23 is an enlarged schematic view of a subset of the unit cell transistors of the transistor amplifier of FIG. 22.

FIG. 23 is an enlarged schematic view of a subset of the unit cell transistors of the transistor amplifier of FIG. 22.

As shown in FIG. 23, the one or more active areas 400 may include a gate bus 402 that is connected to a plurality of gate fingers 406 that extend in parallel in a first direction (e.g., the x-direction indicated in FIG. 23). A source bus 410 is connected to a plurality of parallel ones of the source contacts 416. The source bus 410 may be connected to a ground voltage node on the underside of the semiconductor die 200. A drain bus 420 may be connected to a plurality of drain contacts 426.

As can be seen in FIG. 23, each gate finger 406 runs along the X-direction between a pair of adjacent ones of the source contact 416 and drain contact 426. The semiconductor die 200 may include a plurality of unit cells 430, where each one of the plurality of unit cells 430 includes an individual transistor. One of the plurality of unit cells 430 is illustrated by the dashed Box in FIG. 23, and includes a gate finger 406 that extends between adjacent ones of the source contact 416 and drain contact 426. The "gate width" refers to the distance by which the gate finger 406 overlaps with its associated one of the source contact 416 and drain contact 426 in the X-direction. That is, "width" of a gate finger 406 refers to the dimension of the gate finger 406 that extends in parallel to the adjacent source contact 416/drain contact 426 (the distance along the z-direction). Each of the plurality of unit cells 430 may share one of the source contact 416 and/or a drain contact 426 with one or more adjacent ones of the plurality of unit cells 430. Although a particular number of the of the plurality of unit cells 430 is illustrated in FIG. 23, it will be appreciated that the semiconductor die 200 may include more or less of the plurality of unit cells 430.

Figure 24:
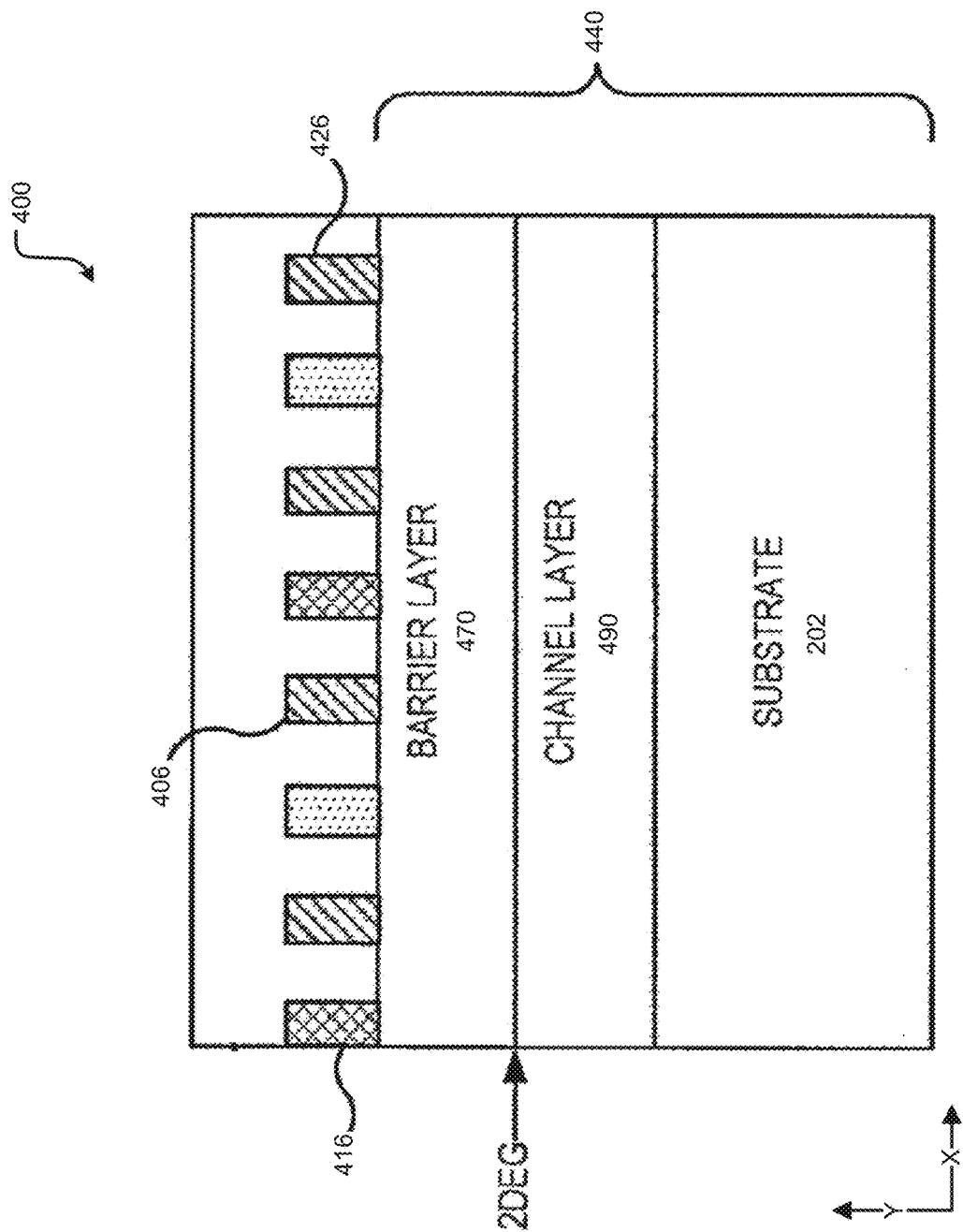
FIG. 24 is a schematic cross-sectional view taken along line XXIV-XXIV of FIG. 23.

FIG. 24 is a schematic cross-sectional view taken along line XXIV-XXIV of FIG. 23.

Referring to FIG. 24, the semiconductor die 200 and/or the active areas 400 may include a semiconductor structure 440 that includes a substrate 202, which may, for example, include 4H—SiC or 6H—SiC. A channel layer 490 may be arranged on the substrate 202, and a barrier layer 470 may be arranged on the channel layer 490 so that the channel layer 490 is between the substrate 202 and the barrier layer 470. The channel layer 490 and the barrier layer 470 may include Group III-nitride based materials, with the material of the barrier layer 470 having a higher bandgap than the material of the channel layer 490. For example, the channel layer 490 may include GaN, while the barrier layer 470 may comprise AlGaN.

Due to the difference in bandgap between the barrier layer 470 and the channel layer 490 and piezoelectric effects at the interface between the barrier layer 470 and the channel layer 490, a two-dimensional electron gas (2DEG) is induced in the channel layer 490 at a junction between the channel layer 490 and the barrier layer 470. The 2DEG acts as a highly conductive layer that allows conduction between the source and drain regions of the device that may be beneath a source contact 416 and a drain contact 426, respectively. The source contact 416 and the drain contact 426 may be on the barrier layer 470. Gate fingers 406 may be on the barrier layer 470 between source contacts 416 and drain contacts 426. While the gate fingers 406 and source contact 416 and drain contacts 426 are all shown as having the same "length" in FIG. 23, it will be appreciated that in practice the gate fingers 406 may have lengths that are substantially smaller than the lengths of the source contacts 416 and drain contacts 426, and it will also be appreciated that the source and drain contacts 426 need not have the same lengths.

The material of the gate finger 406 may be chosen based on the composition of the barrier layer 470. However, in certain embodiments, materials capable of making a Schottky contact to a nitride-based semiconductor material may be used, such as Ni, Pt, NiSi$_x$, Cu, Pd, Cr, W and/or WSiN. The source contacts 416 and drain contacts 426 may include a metal, such as TiAlN, that can form an ohmic contact to GaN.

The input lead pad 114, the input bond pad 232, the output bond pad 288, the output lead pad 116, any other bond pad areas may be formed by a metal surface and may comprise a metallic material such as copper, gold, nickel, palladium, silver, and the like, and combinations thereof.

The semiconductor die 200 may include a metallization layer located on a lower surface of the substrate 202. The metallization layer may be located in a plane generally parallel to the z-axis and/or the x-axis. In one aspect, the metallization layer may be implemented as a full face metallic layer on the lower surface of the substrate 202. Additionally or alternatively, the semiconductor die 200 may be single-sided (one metallic layer), double-sided (two metallic layers on both sides of one substrate layer), or multi-layer (outer and inner layers of aluminum, copper, silver, gold, and/or the like, alternating with layers of substrate). The semiconductor die 200 may include separate conducting lines, tracks, circuit traces, pads for connections, vias to pass connections between layers of aluminum, copper, silver, gold, and/or the like, and features such as solid conductive areas for EM shielding or other purposes. In one or more aspects, the die attach material 124 may not form an electrical connection with the semiconductor die 200. More specifically, the die attach material 124 may be utilized exclusively for attachment of the semiconductor die 200 to the support 102. Accordingly, in this aspect, a bottom of the semiconductor die 200 does not have any electrical contacts. In one or more aspects, the die attach material 124 may form a single electrical connection with the semiconductor die 200. More specifically, the die attach material 124 may be utilized for a single electrical connection of the semiconductor die 200 to the support 102. Accordingly, in this aspect, a bottom of the semiconductor die 200 does not have any electrical contacts. Accordingly, in these aspects, the construction of the package 100 of the disclosure is distinct from multi-connection type circuits utilized in a flip chip, a controlled collapse chip connection, a C4, and/or the like.

Figure 25:
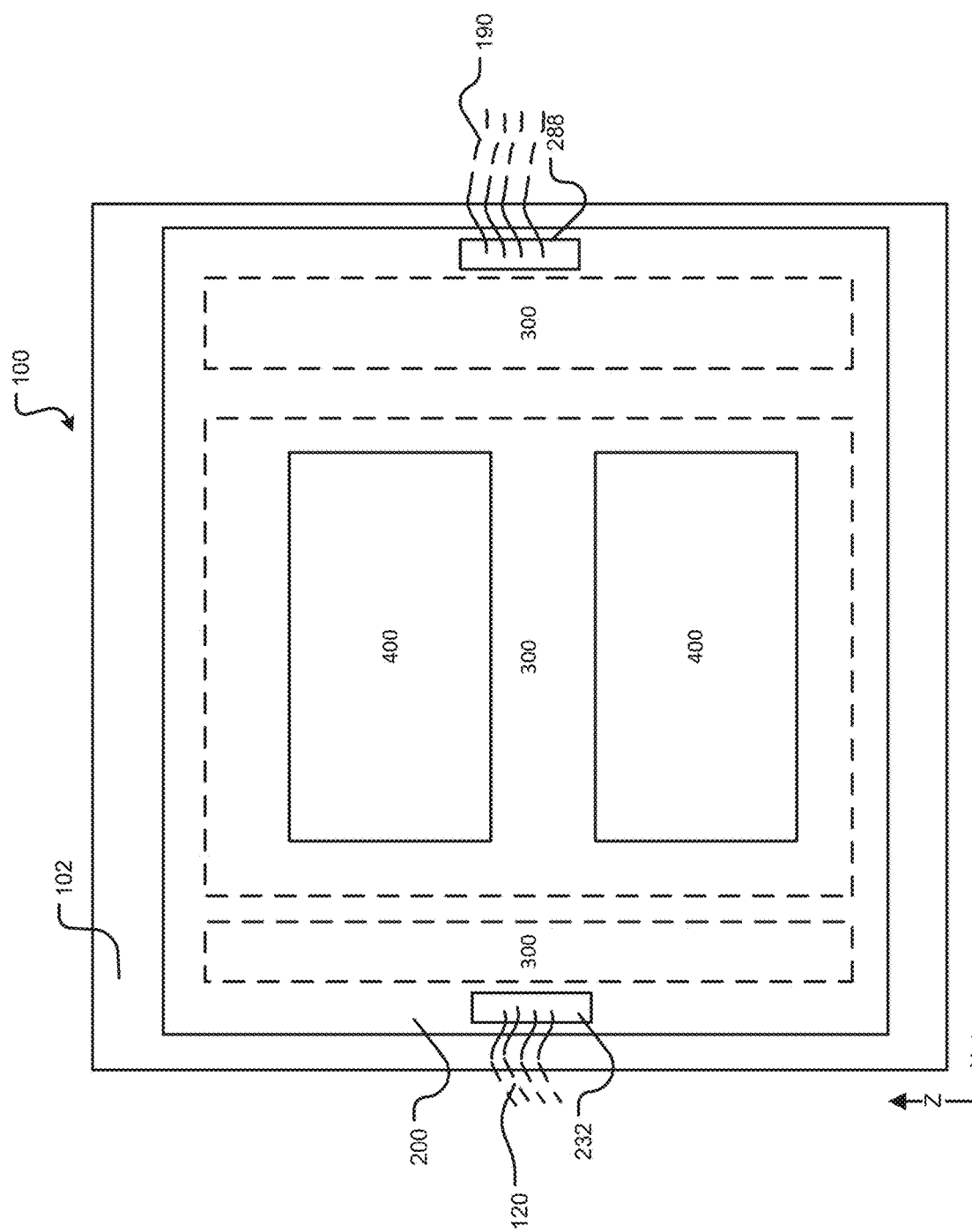
FIG. 25 illustrates a partial top view of a package according to the disclosure.

FIG. 25 illustrates a partial top view of a package according to the disclosure.

In particular, FIG. 25 shows an exemplary implementation of a package 100 that may include any one or more features, components, arrangements, and the like as described herein. More specifically, FIG. 25 illustrates the package 100 implementing the semiconductor die 200 as a large area integrated circuit, a monolithic integrated circuit, a monolithic microwave integrated circuit (MMIC), a multi-celled transistor integrated circuit, an integrated circuit having an array of Field Effect Transistors (FETs), a multi-transistor integrated circuit, a multi-circuit integrated circuit, a multi-unit integrated circuit, a multi-area integrated circuit, a multi-active area integrated circuit, a compound semiconductor device, a high power semiconductor device, a high frequency semiconductor device, a high power/frequency semiconductor device, a compound high power semiconductor device, a compound high frequency semiconductor device, a compound high power/frequency semiconductor device, compound semiconductor devices, high-power compound semiconductor devices, high frequency compound semiconductor devices, and/or the like. For example, the disclosure may be utilized on high power and/or high frequency compound semiconductor devices, such as Group III Nitride transistors, such as GaN based FETs, HEMTs, and/or the like or a MMIC incorporating same. Additionally, the disclosure may be utilized on multistage FET topologies, multi-path FET topologies, and/or the like including Doherty configurations, using MMIC and/or discrete components. Furthermore, the disclosure can also apply to discrete devices, discrete transistors, larger form factor discrete transistors, larger form factor discrete devices, multi-area discrete devices, and/or the like.

In one or more aspects, the package 100 of FIG. 25 illustrates that the various aspects of the disclosure may be utilized with any implementation of the semiconductor die 200 that includes at least one implementation of the one or more active areas 400 and an area of the semiconductor die 200 where the one or more active areas 400 is not implemented. For example, an area where an implementation of the at least one secondary device area 300 is implemented.

As a particular example, the package 100 illustrated in FIG. 25 may include an implementation as a Doherty circuit where at least implementation of the one or more active areas 400 includes a carrier amplifier and a peaking amplifier. In particular, the package 100 may include the carrier amplifier and the peaking amplifier configured such that the package 100 power-combines outputs of the carrier amplifier and the peaking amplifier. In one aspect, the two amplifiers may be biased differently. In one aspect, the carrier amplifier may operate at a normal Class AB or Class B. In one aspect, the peaking amplifier may operate at Class C. Other operating classes are contemplated as well.

Accordingly, the disclosure has disclosed devices and processes for implementing an intentionally constructed channel or a mesh of one or more channels that will allow for outgassing voids to escape in areas that are near but not directly under the active area such as an active transistor. Accordingly, utilizing an application of a channeled void reduction technique as described in the disclosure using the sintered die attach materials provides unexpected results in improved cooling and/or robustness. Moreover, utilizing an application of a channeled void reduction technique as described in the disclosure for GaN packaging using the sintered die attach materials provides unexpected results in improved cooling and/or robustness. In particular, Applicant has tested numerous different processes of reducing the voids and the disclosed channeled approach has been found to exhibit and provide the best results. In particular, the disclosure may be utilized on a large area integrated circuit, a monolithic integrated circuit, a monolithic microwave integrated circuit (MMIC), a multi-celled transistor integrated circuit, an integrated circuit having an array of Field Effect Transistors (FETs), a multi-transistor integrated circuit, a multi-circuit integrated circuit, a multi-unit integrated circuit, a multi-area integrated circuit, a multi-active area integrated circuit, a compound semiconductor device, a high power semiconductor device, a high frequency semiconductor device, a high power/frequency semiconductor device, a compound high power semiconductor device, a compound high frequency semiconductor device, a compound high power/frequency semiconductor device, compound semiconductor devices, high-power compound semiconductor devices, high frequency compound semiconductor devices, and/or the like. For example, the disclosure may be utilized on high power and/or high frequency compound semiconductor devices, such as Group III Nitride transistors, such as GaN based FETs, HEMTs, and/or the like or a MMIC incorporating same. Additionally, the disclosure may be utilized on multistage FET topologies, multi-path FET topologies, and/or the like including Doherty configurations, using MMIC and/or discrete components. Additionally, the disclosure can also apply to discrete devices, discrete transistors, larger form factor discrete transistors, larger form factor discrete devices, multi-area discrete devices, and/or the like.

Additionally, the disclosure has disclosed devices and processes for implementing the overmold 130 arranged on the die attach material 124 and/or the one or more channels 122 that may promote mold compound adhesion of the overmold 130 to the semiconductor die 200 within the package 100. In this regard, there are portions of the die attach material 124 that may extend beyond the semiconductor die 200 covering the support 102. These portions of the die attach material 124 may improve overmold plastic adhesion of the overmold 130 of the package 100 to the support 102. Moreover, these portions of the die attach material 124 may avoid selective plating of the support 102. Additionally, this construction may allow one common package lead frame for all die sizes of the semiconductor die 200 used in a package type. In this regard, various aspects implementing the overmold 130 of the package 100 to the support 102 as described herein allow for a great deal of variability in the size and implementation of the semiconductor die 200.

Moreover, the disclosure has disclosed devices and processes that result in decreased manufacturing costs. Additionally, the disclosure has disclosed devices and processes that can implement various component configurations to reduce package cost, reduce package manufacturing cost, reduce manufacturing complexity, reduce yield loss, and/or the like.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A semiconductor device, comprising:
    a semiconductor die;
    a support; and
    a die attach material configured to attach a lower surface of the semiconductor die to an upper surface of the support,
    wherein the die attach material is structured and arranged on the support to comprise at least one channel,
    wherein the semiconductor die is arranged on at least a portion of the at least one channel arranged on the support,
    wherein the at least one channel is configured to allow gases generated during curing of the die attach material during attachment of the semiconductor die to the support to be released from the die attach material, and
    wherein the die attach material is configured such that the at least one channel is located vertically below and laterally offset from an active area of the semiconductor die.

2. The semiconductor device according to claim 1 wherein:
    the semiconductor die is a Group III-nitride based MMIC (monolithic microwave integrated circuit); and
    the die attach material being arranged on the support to comprise a plurality of portions of the die attach material arranged between the semiconductor die and the support and the plurality of portions comprising the at least one channel therebetween.

3. The semiconductor device according to claim 1 further comprising at least one secondary device area on the support and wherein:
    the die attach material comprises at least a portion of the at least one channel positioned between the at least one secondary device area and the support; and
    the die attach material being arranged on the support such that the at least one channel is defined by one or more side edges of the die attach material, the lower surface of the semiconductor die and the upper surface of the support.

4. The semiconductor device according to claim 1 further comprising a protective material on the support and wherein the die attach material comprises at least a portion of at least one channel positioned between the protective material and the support.

5. The semiconductor device according to claim 1 wherein:
    the die attach material is configured such that the at least one channel comprises multiple channels within the die attach material.

6. The semiconductor device according to claim 1 wherein:
    the die attach material is configured such that the at least one channel forms a mesh within the die attach material.

7. The semiconductor device according to claim 1 wherein:
    the die attach material comprises metal particles in an organic material.

8. The semiconductor device according to claim 1 wherein:
    the semiconductor die comprises an integrated circuit.

9. The semiconductor device according to claim 1 wherein the die attach material is configured such that the at least one channel comprises at least one of the following: a rectangular shape within the die attach material, a polygonal shape within the die attach material, a circular shape within the die attach material, a freeform shape within the die attach material, a continuous shape within the die attach material, a discontinuous shape within the die attach material, and combinations thereof.

10. The semiconductor device according to claim 1 wherein:
    the die attach material is configured utilizing one of the following: die attach material screen-printing processes, die attach material preform processes, die attach material needle dispensing processes, and inkjet die attach material dispensing processes; and
    the die attach material comprises a plurality of portions of the die attach material arranged between the support.

11. The semiconductor device according to claim 1 wherein:
    the semiconductor die comprises at least one active area that is an area that one or more Radio Frequency (RF) semiconductor devices are located;
    the semiconductor die comprises at least one of the following: a GaN based Field-Effect Transistor (FET) and a GaN based high-electron-mobility transistor (HEMT); and
    the semiconductor die comprises at least one secondary device area that comprises portions of one or more of the following: impedance matching circuits, matching circuits, input matching circuits, output matching circuits, intermediate matching circuits, harmonic terminations, harmonic termination circuits, and matching networks.

12. A process of implementing a semiconductor device, comprising:
    providing a semiconductor die;
    providing a support; and
    forming a die attach material on the support that is configured to attach a lower surface of the semiconductor die to an upper surface of the support,
    wherein the forming the die attach material comprising forming at least one channel in the die attach material on the support, and
    wherein the at least one channel is configured to allow gases generated during curing of the die attach material during attachment of the semiconductor die to the support to be released from the die attach material; and
    arranging the die attach material such that the at least one channel vertically below and laterally offset from an active area of the semiconductor die.

13. The process of implementing a semiconductor device according to claim 12 wherein:
    the semiconductor die is a Group III-nitride based MMIC (monolithic microwave integrated circuit); and
    the forming the die attach material comprises forming a plurality of portions of the die attach material arranged on the support and the plurality of portions comprising the at least one channel therebetween.

14. The process of implementing a semiconductor device according to claim 12 further comprising at least one secondary device area on the support and wherein:
    the die attach material comprises at least a portion of the at least one channel positioned between the at least one secondary device area and the support; and the die attach material being arranged on the support such that the at least one channel is defined by the lower surface of the semiconductor die and the upper surface of the support.

15. The process of implementing a semiconductor device according to claim 12 further comprising a protective material on the support and wherein the die attach material comprises at least a portion of at least one channel positioned between the protective material and the support.

16. The process of implementing a semiconductor device according to claim 12 wherein:
the die attach material is configured such that the at least one channel comprises multiple channels within the die attach material.

17. The process of implementing a semiconductor device according to claim 12 wherein:
the die attach material is configured such that the at least one channel forms a mesh within the die attach material.

18. The process of implementing a semiconductor device according to claim 12 wherein:
the die attach material comprises metal particles in an organic material.

19. The process of implementing a semiconductor device according to claim 12
wherein the semiconductor die comprises an integrated circuit.

20. The process of implementing a semiconductor device according to claim 12 wherein the die attach material is configured such that the at least one channel comprises at least one of the following: a rectangular shape within the die attach material, a polygonal shape within the die attach material, a circular shape within the die attach material, a freeform shape within the die attach material, a continuous shape within the die attach material, a discontinuous shape within the die attach material, and combinations thereof.

21. The process of implementing a semiconductor device according to claim 12 wherein:
the forming the die attach material comprises utilizing one of the following: die attach material screen-printing processes, die attach material preform processes, die attach material needle dispensing processes, and inkjet die attach material dispensing processes; and
the forming the die attach material comprises forming a plurality of portions of the die attach material.

22. The process of implementing a semiconductor device according to claim 12 further comprising:
configuring at least one active area as an area that one or more Radio Frequency (RF) semiconductor devices are located;
configuring the one or more Radio Frequency (RF) semiconductor devices as at least one of the following: a GaN based Field-Effect Transistor (FET) and a GaN based high-electron-mobility transistor (HEMT); and
configuring at least one secondary device area as portions of one or more of the following: impedance matching circuits, matching circuits, input matching circuits, output matching circuits, intermediate matching circuits, harmonic terminations, harmonic termination circuits, and matching networks.

\* \* \* \* \*